United States Patent
Previtali

(10) Patent No.: US 10,128,332 B2
(45) Date of Patent: Nov. 13, 2018

(54) METHOD FOR FABRICATING AN IMPROVED FIELD EFFECT DEVICE

(71) Applicant: COMMISSARIAT À L'ENERGIE ATOMIQUE ET AUX ENERGIES ALTERNATIVES, Paris (FR)

(72) Inventor: Bernard Previtali, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 104 days.

(21) Appl. No.: 15/137,103

(22) Filed: Apr. 25, 2016

(65) Prior Publication Data

US 2016/0315143 A1    Oct. 27, 2016

(30) Foreign Application Priority Data

Apr. 23, 2015  (FR) ..................... 15 53636

(51) Int. Cl.

| | |
|---|---|
| *H01L 29/06* | (2006.01) |
| *H01L 29/417* | (2006.01) |
| *H01L 29/66* | (2006.01) |
| *H01L 29/786* | (2006.01) |
| *H01L 27/12* | (2006.01) |
| *H01L 21/02* | (2006.01) |
| *H01L 21/28* | (2006.01) |
| *H01L 21/308* | (2006.01) |

(Continued)

(52) U.S. Cl.
CPC .... *H01L 29/0642* (2013.01); *H01L 21/02636* (2013.01); *H01L 21/28008* (2013.01); *H01L 21/308* (2013.01); *H01L 21/31055* (2013.01); *H01L 21/7624* (2013.01); *H01L 27/1266* (2013.01); *H01L 29/41725* (2013.01); *H01L 29/41733* (2013.01); *H01L 29/6656* (2013.01); *H01L 29/66636* (2013.01); *H01L 29/66772* (2013.01); *H01L 29/78648* (2013.01)

(58) Field of Classification Search
CPC .......... H01L 29/0642; H01L 21/02636; H01L 21/28008

See application file for complete search history.

(56) References Cited

U.S. PATENT DOCUMENTS

| | | |
|---|---|---|
| 6,335,214 B1 | 1/2002 | Fung |
| 7,915,110 B2 | 3/2011 | Coronel et al. |

(Continued)

OTHER PUBLICATIONS

La Tulipe Jr., et al; "Upside-Down FETs;" 2008 IEEE International SOI Conference Proceedings; pp. 23-24.

*Primary Examiner* — Errol Fernandes
(74) *Attorney, Agent, or Firm* — Oliff PLC

(57) ABSTRACT

A SOI substrate is covered by a semiconductor material pattern which includes a dividing pattern made from electrically insulating material. The dividing pattern is coated by one or more semiconductor materials. The semiconductor material pattern is covered by a gate electrode which is facing the dividing pattern. The semiconductor material pattern and the gate pattern are covered by a cap layer. The substrate is eliminated to access the source/drain regions. Two delineation patterns are formed to cover the source region and drain region and to leave the dividing pattern free. A second cap layer is deposited and access vias are formed to access the source/drain regions by elimination of the delineation patterns.

17 Claims, 26 Drawing Sheets

(51) Int. Cl.
*H01L 21/3105* (2006.01)
*H01L 21/762* (2006.01)

(56) References Cited

U.S. PATENT DOCUMENTS

| | | |
|---|---|---|
| 2006/0027881 A1 | 2/2006 | Ilicali et al. |
| 2009/0224295 A1 | 9/2009 | Coronel et al. |
| 2011/0241073 A1 | 10/2011 | Cohen et al. |
| 2012/0248544 A1* | 10/2012 | Yokoyama .............. H01L 21/84 |
| | | 257/369 |
| 2013/0200438 A1* | 8/2013 | Liu ...................... G01N 27/414 |
| | | 257/253 |
| 2013/0299897 A1 | 11/2013 | Doris et al. |

\* cited by examiner

METHOD FOR FABRICATING AN IMPROVED FIELD EFFECT DEVICE

BACKGROUND OF THE INVENTION

The invention relates to a method for fabricating a field effect device.

STATE OF THE ART

The continuous increase of the performances of integrated circuits, for example in terms of consumption and/or operating frequency, is ineluctably resulting in a constant reduction of the size of its components. In order to produce devices with ever improved performances, new architectures and/or new materials have been integrated in the transistors.

However, it is apparent that for a large number of architectures, stray capacitances are occupying an increasingly large place which reduces the gains procured by the other improvements. One way of reducing these stray capacitances is to place the source and drain contacts on one side of the semiconductor material film forming the conduction channel and the source/drain regions. The gate electrode is located on the other side of the semiconductor film which greatly reduces the facing surface between the gate electrode and the contacts. An exemplary embodiment is described in U.S. Pat. No. 7,915,110. However, this fabrication method proves complicated to achieve as it requires amorphization of the future source and drain regions and the use of the optic property difference between the amorphous regions and the crystalline regions in order to locate the protection masks correctly.

The document US 2013/0299897 describes fabrication of an inverted transistor with source and drain contact connections on the opposite surface from the gate electrode. A gate electrode is fabricated on a semiconductor on insulator substrate.

The gate electrode acts as etch mask for etching the layer of semiconductor on insulator, the buried insulating layer and then a part of the semiconductor support substrate.

Epitaxy is performed from the support substrate to connect the support substrate with the layer of semiconductor on insulator. The epitaxied regions form the source and drain regions. A cap is deposited and is bonded to a second support substrate.

The first support substrate is eliminated to access the buried insulating layer and the source and drain regions formed by epitaxy. A new cap is deposited and then etched to form source and drain contacts.

This document also teaches how to fabricate a second gate electrode using the buried insulator as gate dielectric.

On reading of this document it can easily be observed that fabrication of such a device is very difficult and that the final device will not present as good performances as expected.

OBJECT OF THE INVENTION

The object of the invention is to provide a field effect device which presents improved electric performances and which is easier to implement.

The method according to the invention is characterized in that it successively comprises:
providing a substrate covered by
a dividing pattern,
a semiconductor material pattern covering the dividing pattern, the dividing pattern comprising at least three consecutive surfaces covered by the semiconductor material pattern,
a gate pattern covering the dividing pattern and the semiconductor material pattern so as to define a source region, a drain region and a conduction channel in the semiconductor material pattern,
depositing a cap layer so as to cover the substrate, the semiconductor material pattern and the gate pattern,
eliminating the substrate so as to release a part of the source region, the drain region and the gate pattern,
forming two delineation patterns covering the source and drain regions and leaving the dividing pattern free,
depositing a second cap layer, the first and second cap layers being separated by the semiconductor material pattern on at least a part thereof,
eliminating the two delineation patterns to form access vias to the source region and the drain region.

In a particular embodiment, the delineation patterns are formed by selective deposition from the source and drain regions.

It is also possible to provide for a chemical mechanical polishing step of the second cap layer configured to release the delineation patterns.

In advantageous manner, the method further comprises formation of lateral spacers on the edges of the delineation patterns.

In a preferred embodiment, the method comprises formation of lateral spacers on the edges of the second cap layer after elimination of the delineation patterns. More particularly, the additional lateral spacers are formed on the edges of the lateral spacers after elimination of the delineation patterns. In advantageous manner, an alloy is formed between a metal and a semiconductor material forming the source and drain regions and the additional lateral spacers are fabricated after formation of the alloy.

In a particular embodiment, the dividing pattern is partially etched.

In a more precise embodiment, the method successively comprises:
elimination of the dividing pattern,
formation of a gate dielectric,
deposition of an electrically conducting material between the two delineation patterns to form a gate electrode.

It is particularly advantageous to provide for the lateral spacers to comprise at least one layer made from a material having a lower dielectric constant than that of silicon oxide.

It is further possible to provide a chemical mechanical polishing step to localise the electrically conducting material between the two delineation patterns.

In an alternative embodiment, the gate dielectric is deposited on the delineation patterns before deposition of the electrically conducting material.

In a particular embodiment, the substrate is covered by a semiconductor material pattern comprising a first layer made from first semiconductor material covering a second layer made from second semiconductor material.

The method comprises:
etching the first layer made from first semiconductor material using the gate pattern as etch mask,
etching the second layer made from second semiconductor material so as to form a cavity and to suspend the first layer made from first semiconductor material,
depositing a filling material so as to fill the cavity,
etching the filling material using the gate pattern as etch mask to form the dividing pattern in the cavity.

In even more particular manner, the method further comprises a selective epitaxy step so as to form the source and drain regions after formation of the dividing pattern.

In an alternative embodiment, the substrate is covered by a semiconductor material pattern successively comprising a first layer made from first semiconductor material, a second layer made from second semiconductor material and a third layer made from third semiconductor material. The etches of the second layer and of the filling material are configured to protect at least a part of the third layer so as to enable formation of the source and drain regions from the third layer when the selective epitaxy step is performed.

More particularly, the dividing pattern is made from an electrically insulating material and, after elimination of the substrate, the method comprises deposition of a metallic material and annealing of the latter to form an alloy between the metallic material and a semiconductor material forming the source and/or drain regions.

BRIEF DESCRIPTION OF THE DRAWING

Other advantages and features will become more clearly apparent from the following description of particular embodiments of the invention given for non-restrictive example purposes only and represented in the appended drawings, in which.

Figures A represent a cross-section along a longitudinal axis of the gate electrode. Figures B represent a cross-section along a transverse axis of the gate electrode.

DESCRIPTION OF A PREFERRED
EMBODIMENT OF THE INVENTION

Figure 1A:
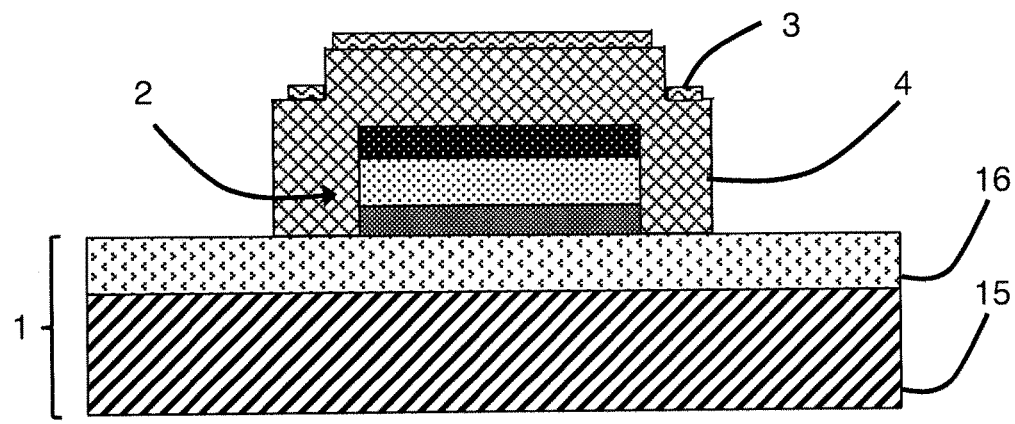
FIG. 1A to FIG. 11B represent successive steps of a method for fabricating a field effect transistor, in schematic manner, in cross-sectional view, FIG. 12A
Figure 1B:
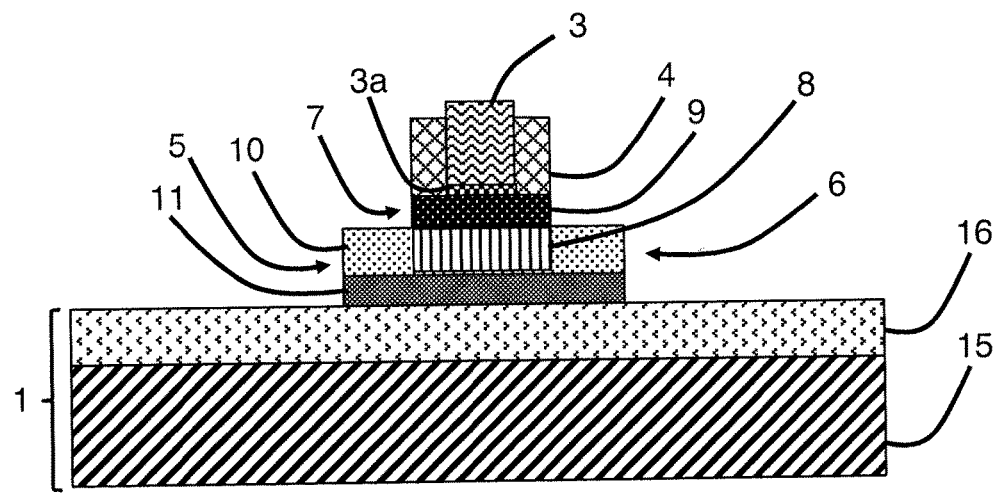

As illustrated in FIG. 1, the method for fabricating a field effect device in a first instance comprises provision of a substrate 1 one surface of which is covered by a semiconductor material pattern 2. The semiconductor material pattern 2 is partially covered by a gate pattern 3. The semiconductor material pattern 2 can also be covered by a lateral spacer 4. In the illustrated embodiment, the semiconductor material pattern 2 is salient from the substrate 1. FIG. 1A represents a cross-section along a longitudinal axis of the gate pattern. FIG. 1B represents a cross-section along a transverse axis of the gate pattern.

Within the semiconductor material pattern 2, the gate pattern 3 defines a source region 5, a drain region 6 and a conduction channel which connects the source region 5 and drain region 6. The conduction channel is located underneath the gate pattern 3.

The semiconductor material pattern 2 can comprise a salient region also called conduction region 7 which is located underneath the gate pattern 3 and between the future source region 5 and drain region 6. The conduction region 7 is made from semiconductor material. It can also be envisaged to have a continuous film which forms the conduction channel and the source and drain regions 5 and 6. In this configuration, the conduction region 7 is not necessarily salient with respect to the source and drain regions. The conduction channel corresponds substantially or exactly to the future conduction channel.

The semiconductor film of FIG. 1B can overlap on each side so as to extend beyond the gate pattern 3.

The semiconductor material pattern 2 covers or coats a dividing pattern 8 which is arranged underneath the gate electrode 3 and more precisely underneath the conduction region 7 so that the source region 5 and drain region 6 are separated by the dividing pattern 8 over at least a part of their thickness. The dividing pattern 8 comprises at least three consecutive surfaces covered by the semiconductor material pattern 2.

In a particular embodiment, the semiconductor material pattern 2 is formed by a stack of at least a first layer 9 made from first semiconductor material covering a second layer 10 made from second semiconductor material. The two semiconductor materials 9 and 10 are different. In advantageous manner, the first and second layers are monocrystalline and preferentially lattice matched. The first layer 9 is for example made from silicon and the second layer 10 is made from a silicon-germanium alloy, preferentially an alloy containing 30% of germanium, preferably 30% atomic.

Figure 2:
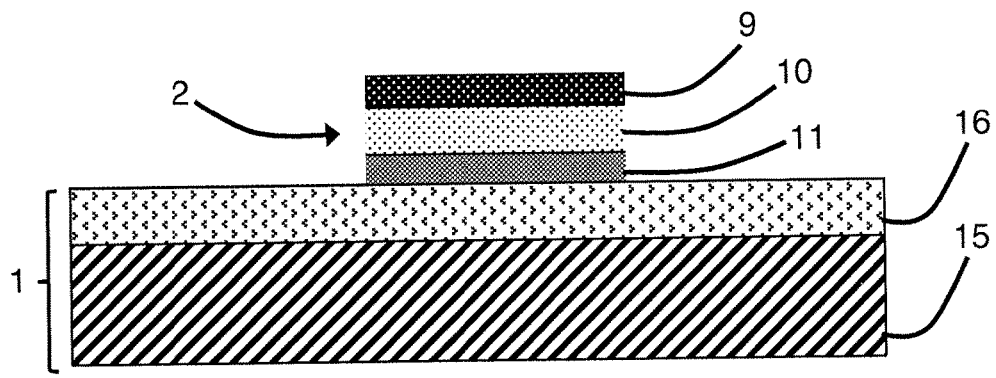

In an even more advantageous embodiment illustrated in FIGS. 1A, 1B and 2, the second layer 10 made from second semiconductor material covers a third layer 11 made from third semiconductor material. The second semiconductor material is different from the third semiconductor material. The first semiconductor material can be identical to the third semiconductor material. Advantageously, the three layers 9, 10 and 11 are monocrystalline and preferentially lattice matched.

The first and third layers 9 and 11 are for example made from silicon and the second layer 10 is made from a silicon-germanium alloy, preferentially an alloy containing 30% of germanium, preferably 30% atomic.

This advantageous structure can be produced simply by means of the following method.

Figure 3A:
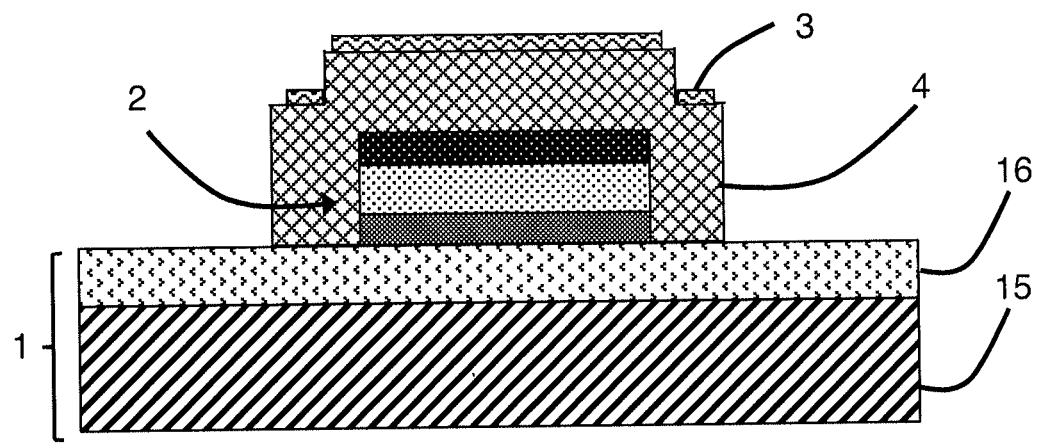
Figure 3B:
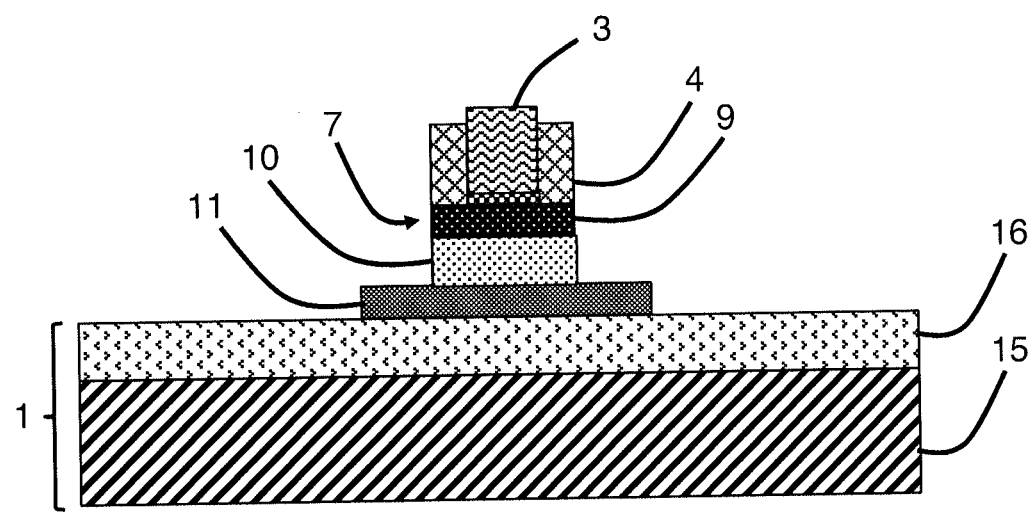

In advantageous manner illustrated in FIGS. 3A and 3B, the gate pattern 3 and lateral spacer 4 are formed on the pattern 2 and are used to act as etch mask for the first layer 9 and second layer 10. The etched region in the first layer 9 forms the conduction region 7 which is representative of the conduction channel. The etching is advantageously anisotropic in order to define a conduction region 7 which presents the same lateral dimensions or substantially the same lateral dimensions as the gate electrode 3 and lateral spacer 4. The lateral spacer 4 can be formed by one or more layers. It is particularly advantageous to have a gate pattern 3 which overlaps on the two opposite edges of the pattern 2.

Figure 4A:
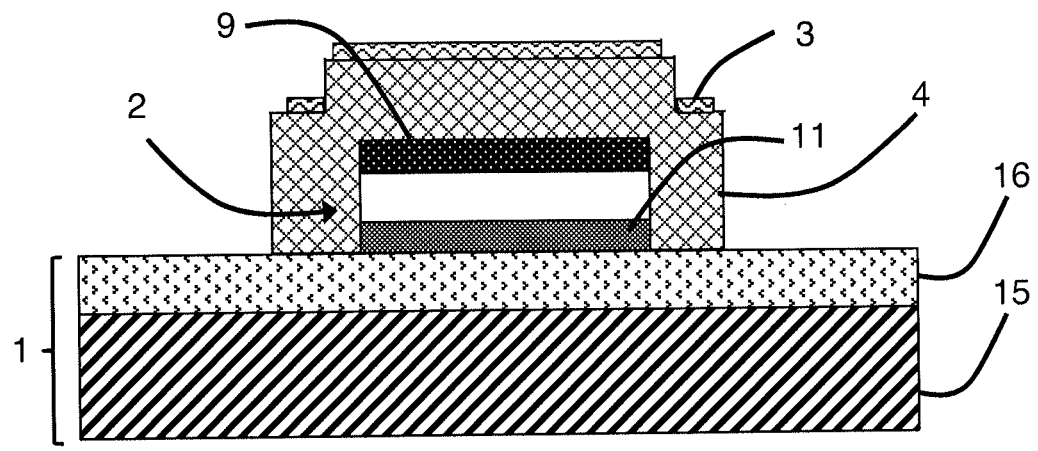
Figure 4B:
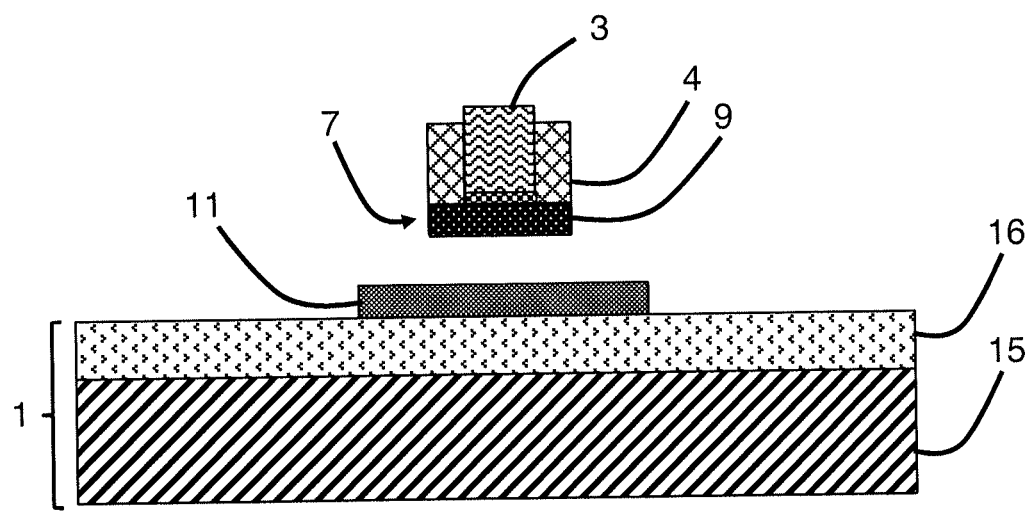

As illustrated in FIGS. 4A and 4B, the second layer 10 is then eliminated by any suitable technique. The etching can be performed by wet etch chemistry or by reactive ion etching. The first layer 9 is then suspended above the substrate 1. The first layer 9 is secured by means of the gate pattern 3 and/or lateral spacer 4. Etching of the second layer 10 is advantageously an isotropic etching. The etching of the second layer 10 forms a cavity underneath the layer 9.

Figure 5A:
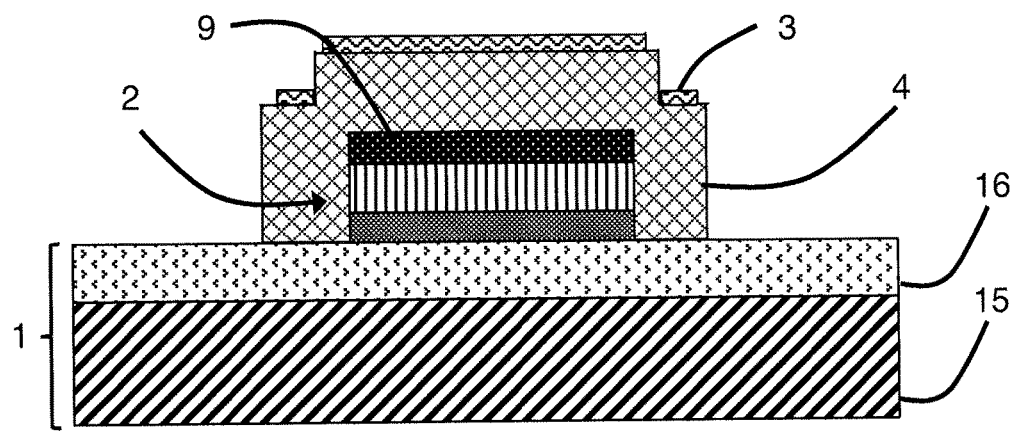
Figure 5B:
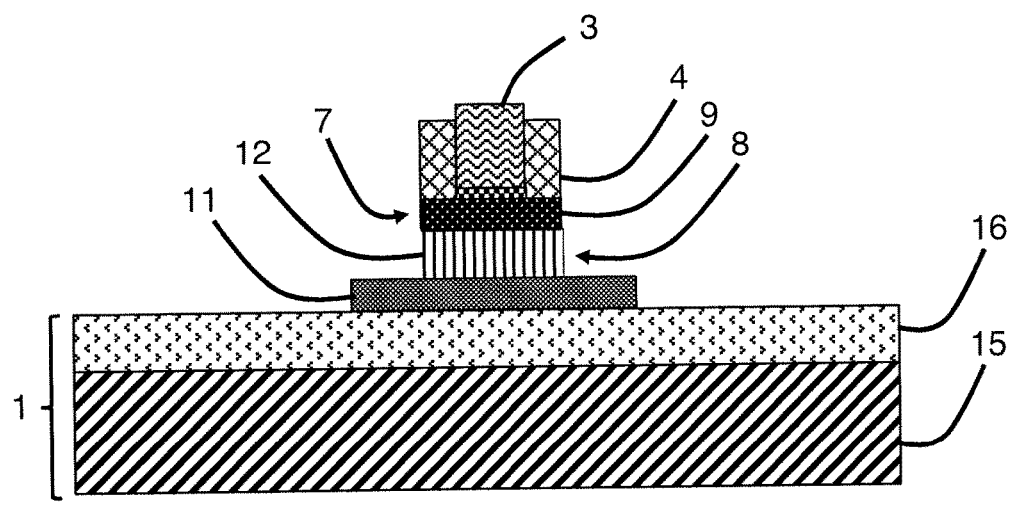

As illustrated in FIGS. 5A and 5B, a filling material 12 is deposited and etched so as to fill the cavity arranged underneath the first layer 9 in the extension of the gate pattern 3 and possibly of the lateral spacer 4. In this way, the conduction pattern 7 and the filling material 12 forming the dividing pattern 8 present aligned side walls which form the walls of the pattern 2.

In advantageous manner, the filling material 12 is deposited in conformal manner so as to fill the cavity completely. The gate pattern 3 and lateral spacer 4 are again used to form an etch mask which localises the filling material 12 exclusively underneath the first layer 9. The pattern formed by the filling material 12 forms the dividing pattern 8. The filling material 12 is for example a silicon oxide and more particularly an oxide deposited at high temperature (HTO). The thickness of filling material 12 is advantageously more than half of the thickness of the second layer 10 or of the height of the cavity which exists underneath the first layer 9.

As a variant, another filling material can be deposited such as silicon nitride or a stack of several layers. It can also be envisaged to provide for oxidation of the first layer 9 to fill the cavity. In the latter instance, the thickness and width of the first layer 9 are chosen accordingly and deoxidization of the flanks of the first layer 9 is performed to enable a future epitaxy step. If a layer 11 is used, the latter can be oxidized.

It is also possible to provide for filling of the cavity by several layers at least one of which is tensile stressed or compressive stressed so as to apply stresses on the conduction channel. In advantageous manner, for an Nmos transistor, the stack of layers comprises at least one tensile-stressed silicon nitride layer. For a Pmos transistor, the stack of layers comprises at least one compressive-stressed silicon nitride layer.

Figure 6A:
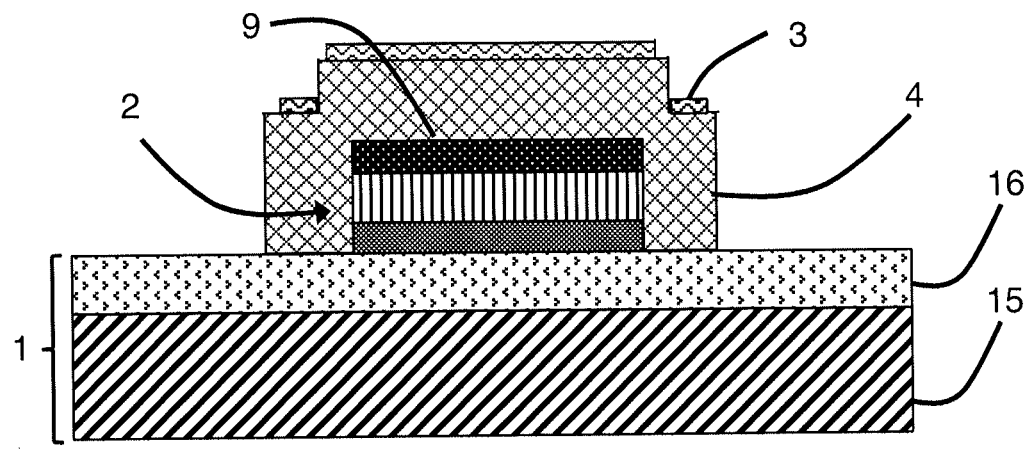
Figure 6B:
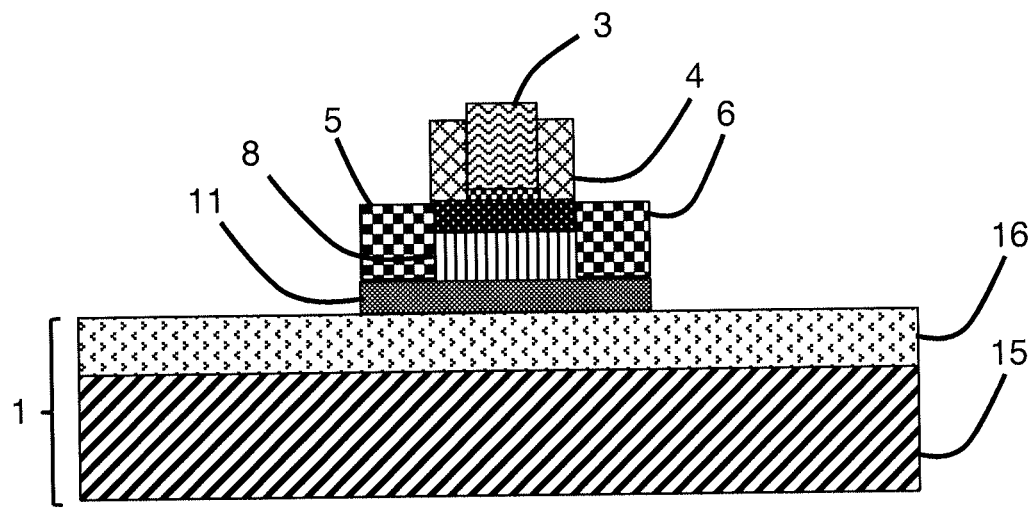

As illustrated in FIGS. 6A and 6B, selective epitaxy is then performed to make a semiconductor material grow from the first layer 9 and form the source and drain regions. In this case, it is particularly advantageous to use the third layer 11 which enables the surface available for starting the epitaxy to be increased. The deposited semiconductor material will form the source region 5 and drain region 6.

The document US2013/0299897 describes growth of a silicon or silicon-germanium layer from the support substrate and the layer of semiconductor on insulator. However, the support substrate and layer of semiconductor on insulator are not aligned when the semiconductor on insulator substrate is formed. This slight misalignment prevents very good quality epitaxy resumption and crystalline defects can form in the source and drain regions. On the other hand, in the method presented above, the epitaxy is performed from layer 9 or from layers 9 and 11 which were initially lattice matched. This precaution enables an epitaxy resumption of better quality to be obtained.

To form different transistors, it is also possible to provide different stacks on the substrate, for example with different thicknesses of layer 10, which is not possible with a semiconductor on insulator substrate.

The semiconductor material pattern 2 can be doped by implantation of electric dopants in the source region 5 and drain region 6. If epitaxy is performed, it can also be envisaged to perform in-situ doping when deposition of the semiconductor material by epitaxy is performed.

When the selective epitaxy step is performed, it is possible to differentiate between Nmos transistors and Pmos transistors by performing two different steps which are designed to deposit two different materials. For Pmos transistors, it is advantageous to deposit a silicon-germanium alloy. For Nmos transistors, it is advantageous to deposit silicon.

The use of a semiconductor on insulator substrate as described in the document US 2013/0299897 also does not enable tensile-stressed regions and compressive-stressed regions to be formed by means of the buried insulator layer.

In an advantageous embodiment that is not represented, a second lateral spacer is formed in addition to the lateral spacer 4. This second lateral spacer covers a part of the source and drain regions. Implantation of electric dopants is performed with a higher dose so as to form weakly resistive source/drain regions. The second lateral spacer enables the dopants to be offset with respect to the conduction channel.

Figure 7A:
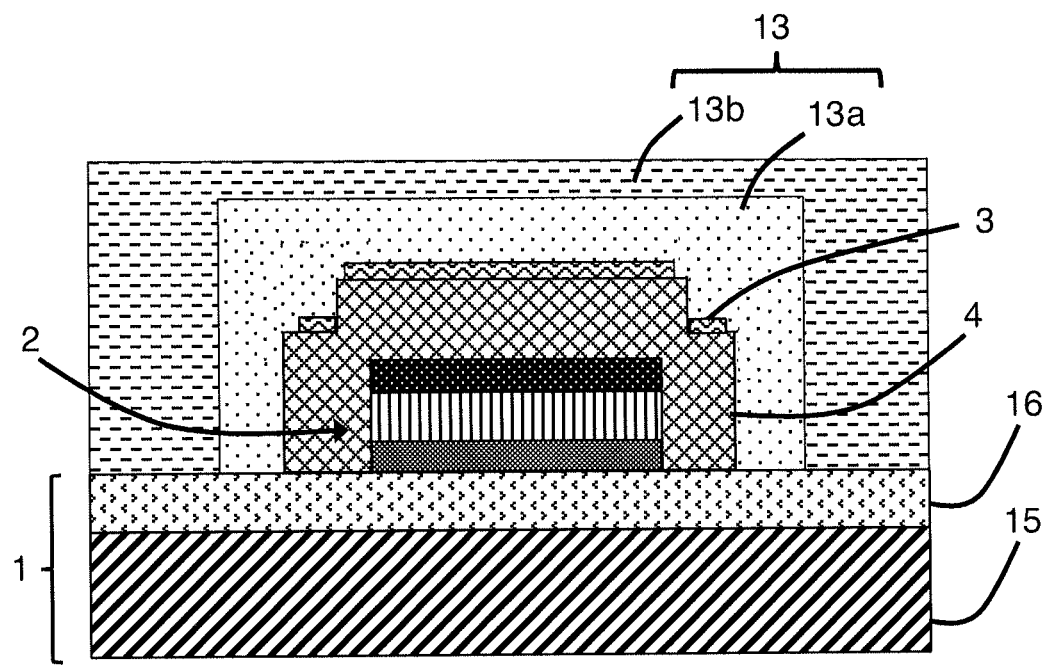
Figure 7B:
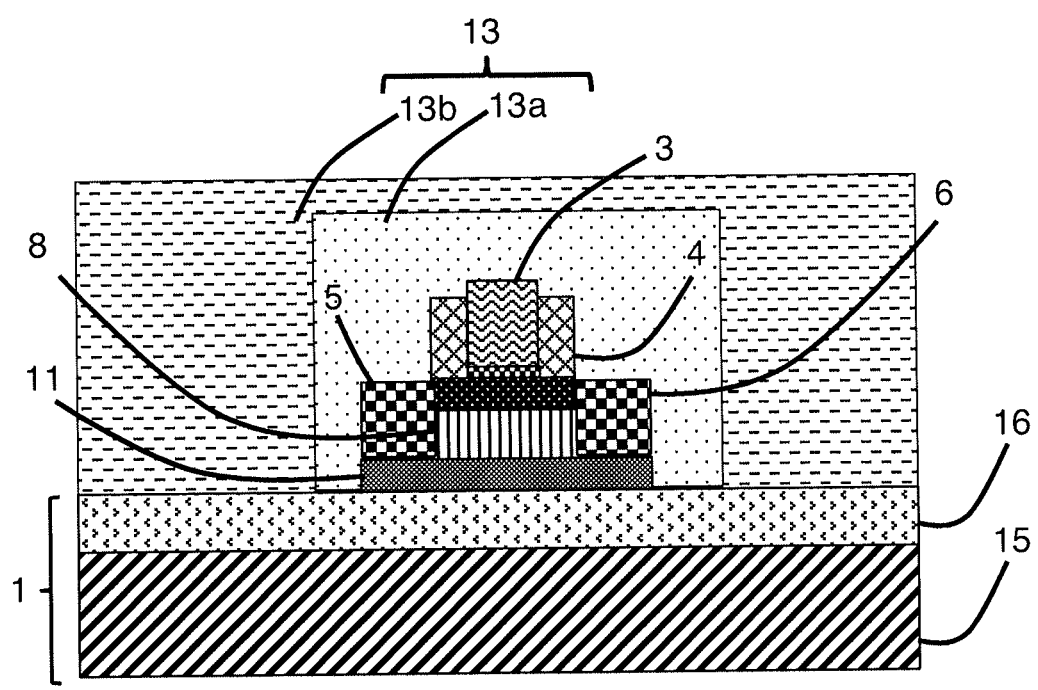

As illustrated in FIGS. 7A and 7B, the assembly is then covered by at least one electrically insulating cap layer 13. In the illustrated embodiment, the cap layer comprises a first cap sub-layer 13a which is in contact with the source/drain regions and the gate pattern 3. A second cap sub-layer 13b is deposited so as to cover the first sub-layer 13a and to form a flatter external surface. In advantageous manner, a planarization step is performed to form a flat top surface. For example, planarization is performed by a chemical mechanical polishing step. The layer 13a can be patterned before deposition of the layer 13b or be left unchanged.

Figure 8A:
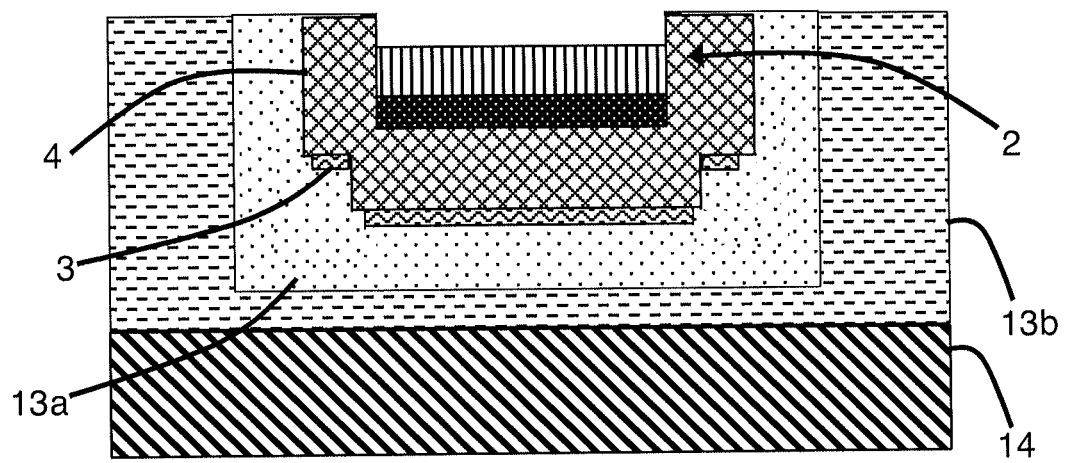
Figure 8B:
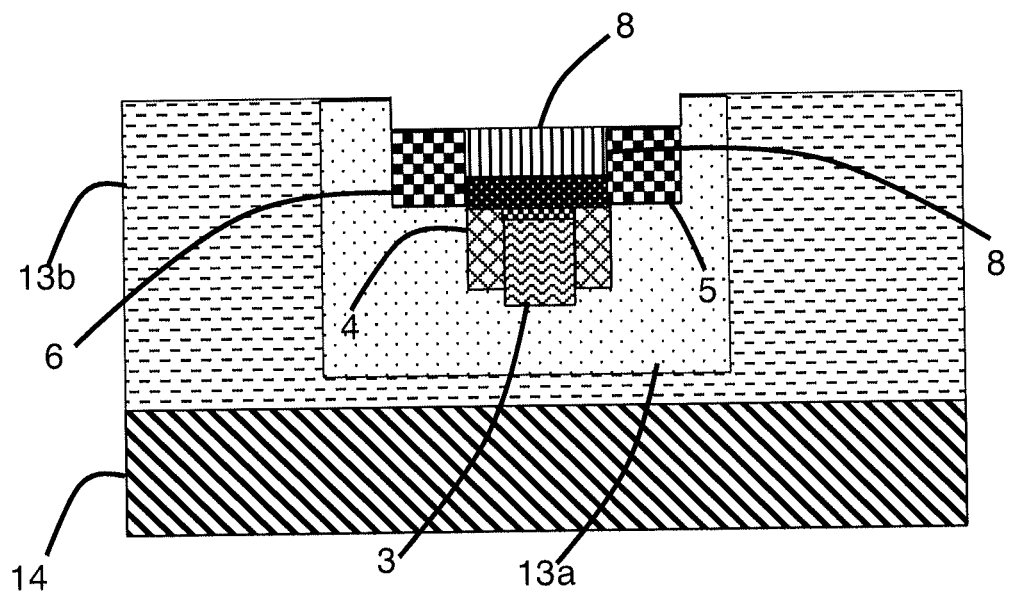

As illustrated in FIGS. 8A and 8B, the top surface of the cap layer 13 is then fixed to a second substrate 14 and the first substrate 1 is eliminated so as to access the dividing pattern 8, the source region 5 and drain region 6 and the gate pattern 3. In advantageous manner, the top surface of the cap layer 13 is bonded to the second substrate 14. For example purposes, the second substrate 14 is a bulk silicon substrate which advantageously comprises a silicon oxide surface layer to facilitate bonding of the cap layer 13. In the embodiment illustrated in FIGS. 8A and 8B, the layer 11 is completely eliminated. As a variant, it is possible to leave the layer 11 on the source and drain regions but a specific etch mask has to be formed to prevent short-circuiting between the source and drain regions. The layer 11 can be electrically conducting to subsequently form the source and drain contacts.

To facilitate elimination of the first substrate 1, it is advantageous to use a substrate of semiconductor on insulator type in which the second layer 10 or third layer 11 is formed by the active layer of substrate 1. This active layer is separated from the support substrate 15 by the electrically insulating layer 16. Support substrate 15 is eliminated to access the electrically insulating layer 16. The electrically insulating layer 16 is then eliminated freeing access to the source/drain regions, dividing pattern 8 and gate pattern 3. The silicon support substrate 15 can be eliminated by mechanical abrasion followed by chemical abrasion with a TMAH solution. The electrically insulating layer 16 can then be eliminated by a solution of hydrofluoric acid type. For example, a solution containing between 0.1% and 2% of hydrofluoric acid enables a high level of selectivity to be had with respect to the materials commonly used in formation of a field effect device, for example silicon nitride, a gate dielectric with a higher permittivity.

As a variant, it is also possible to provide a substrate 1 which comprises a support part 15 separated from the second or third layer by a different material 16 so as to facilitate etching of the support 15 with detection of the layer of different material 16. The layer of different material 16 is then selectively etched to free access to the desired regions. The different material 16 is for example a silicon-germanium alloy layer.

In spite of the change of active surface resulting from replacement of the substrate 1 by the substrate 14, it is possible to make source and/or drain contacts easily with the source and/or drain regions.

After elimination of the substrate 1, access is easy to the source region 5 and drain region 6, the conduction channel and gate electrode 3.

Figure 9A:
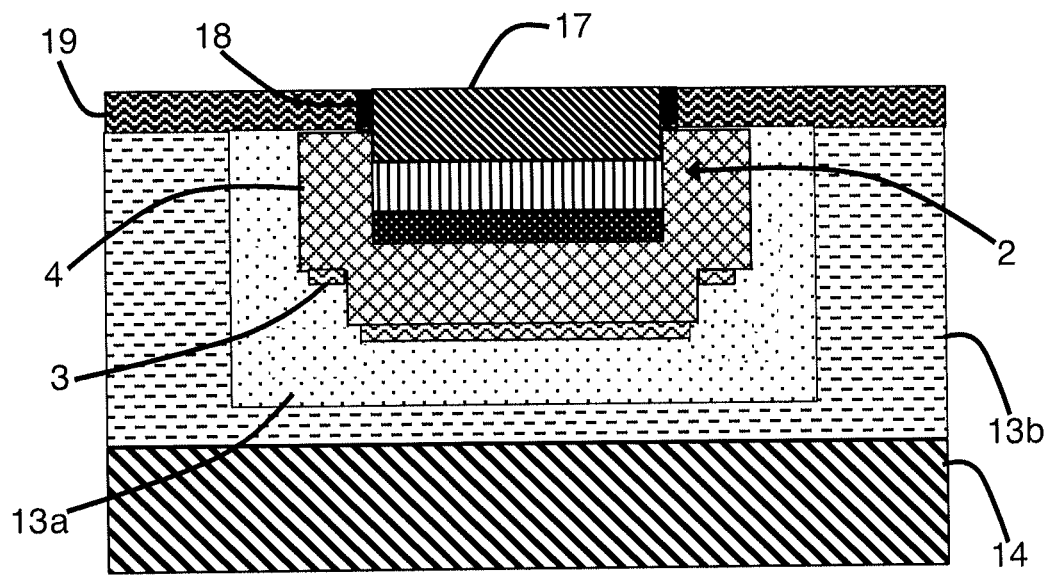
Figure 9B:
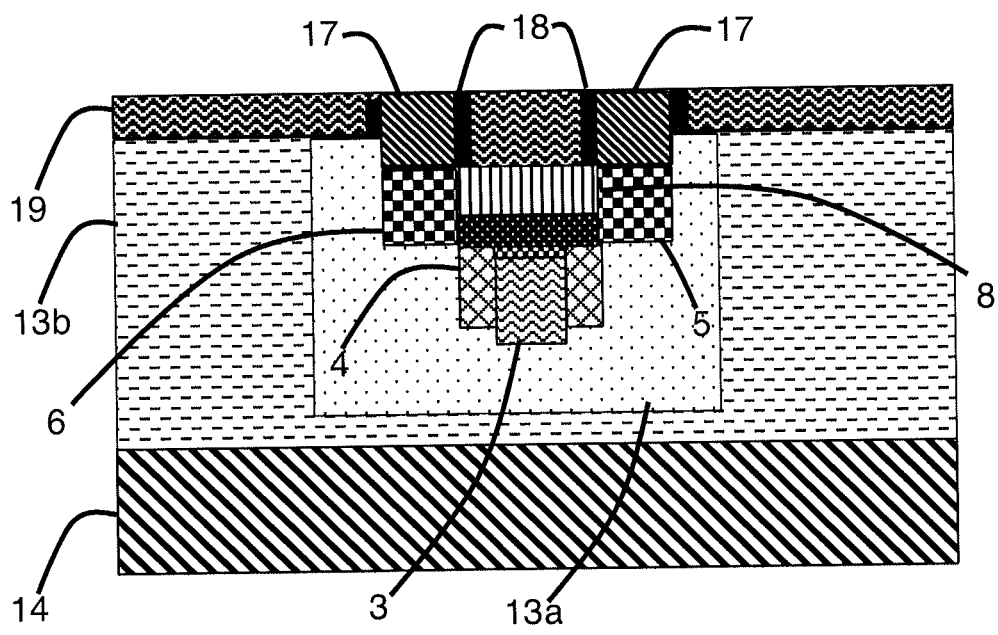

As illustrated in FIGS. 9A and 9B, two delineation patterns 17 are formed on the source region 5 and drain region 6 in order to cover and protect the source and drain regions. The delineation patterns 17 release a region above the dividing pattern 8. In advantageous manner, the delineation patterns 17 completely cover the source region 5 and drain region 6. It is particularly advantageous to have patterns 17 which have the same lateral dimensions as the source and drain regions.

The delineation patterns 17 can be formed by any suitable technique, for example by deposition of a layer of a first material followed by a photolithography and etching step of this first material. As the delineation patterns are formed in contact with the source and drain regions, the alignment signals are hardly disturbed which facilitates positioning of the patterns 17 with respect to the source and drain regions.

In advantageous manner, the delineation patterns 17 are formed by means of selective deposition from the source region 5 and drain region 6. In this manner, the delineation patterns 17 are self-aligned with the source region 5 and drain region 6. For example purposes, the delineation patterns 17 are formed by selective epitaxy of silicon or of silicon-germanium alloy. As a variant, it can also be envisaged to perform non-selective deposition of a material which will have a monocrystalline structure on the source and drain regions and a polycrystalline or amorphous structure outside the source and drain regions. Preferential etching of the amorphous or polycrystalline regions with respect to the monocrystalline region enables the delineation pattern 17 to be located above the source and drain regions. In advantageous manner, the material forming the delineation patterns 17 is different from the material forming the source region 5 and drain region 6.

It is advantageous to dope the source and drain regions before forming the patterns 17 as the source and drain regions are accessible.

In advantageous manner illustrated in FIGS. 9A and 9B, a lateral spacer 18 is formed on the side walls of the delineation patterns 17. It is particularly advantageous to make the lateral spacer 18 from an electrically insulating material. The lateral spacer 18 covers a part of the dividing pattern 8.

A second cap layer 19 or a part of the second cap layer 19 is deposited so as to cover the dividing pattern 8 and to fill the spaces between the delineation patterns 17.

In advantageous manner illustrated in FIGS. 9A and 9B, deposition of the second cap layer 19 is followed by a chemical mechanical polishing step to form a flat surface defined by the delineation patterns 17 and the second cap layer 19.

This configuration is particularly advantageous as it enables the source and drain regions to be easily localised by means of the delineation patterns 17. The rest of the device is protected by the cap layer 19.

Figure 10A:
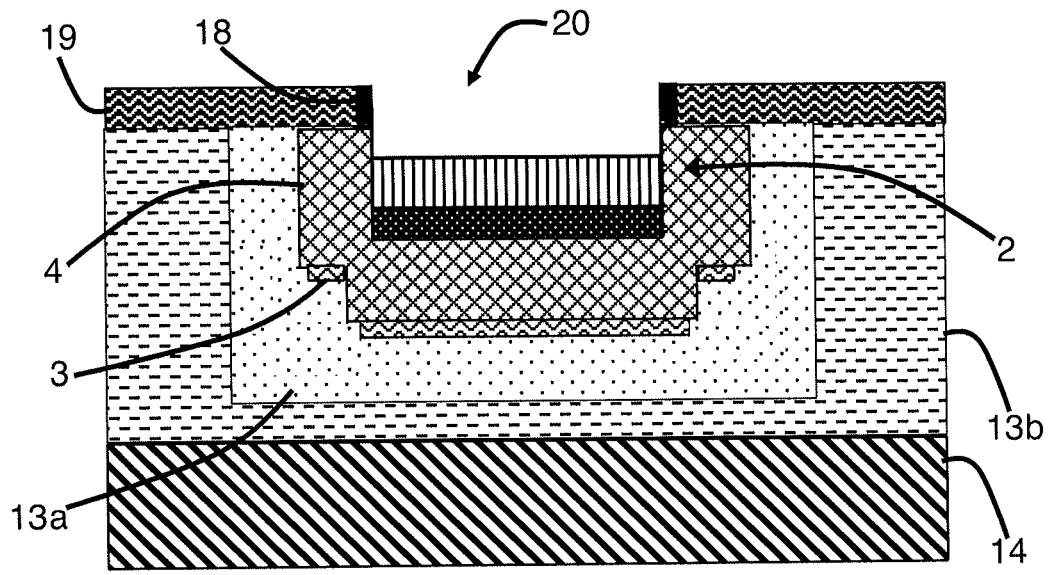
Figure 10B:
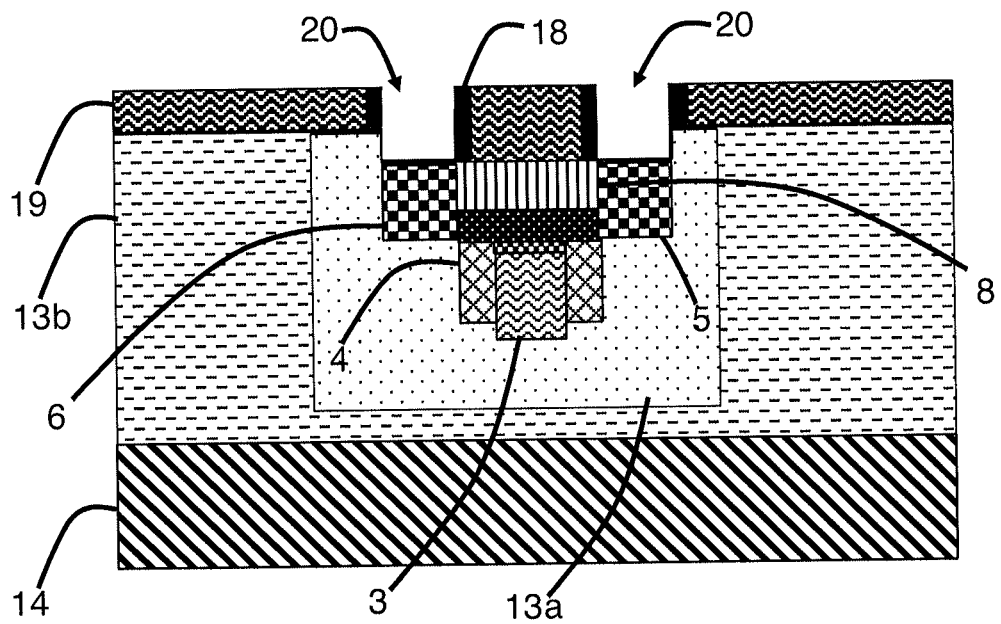

As illustrated in FIGS. 10A and 10B, the delineation patterns 17 are then eliminated to access the source region 5 and drain region 6. Elimination of the delineation patterns 17 forms cavities 20. In this step, it is also possible to dope the source and drain regions by low-energy implantation.

In optional manner, a new lateral spacer (not shown) can be formed on the side walls of the cavities 20. As an alternative, it is possible not to form the lateral spacer 18 on the edges of the patterns 17 before deposition of the layer 19 but to form the lateral spacer 18 on the edge of the layer 19 after elimination of the patterns 17.

The new lateral spacer can be used to shift the edges of the source and drain contacts thereby reducing stray capacitances. As previously, the new lateral spacer can be formed by a deposition step advantageously in conformal manner followed by an anisotropic etching step in a direction perpendicular to the surface of the layer 19.

Figure 11A:
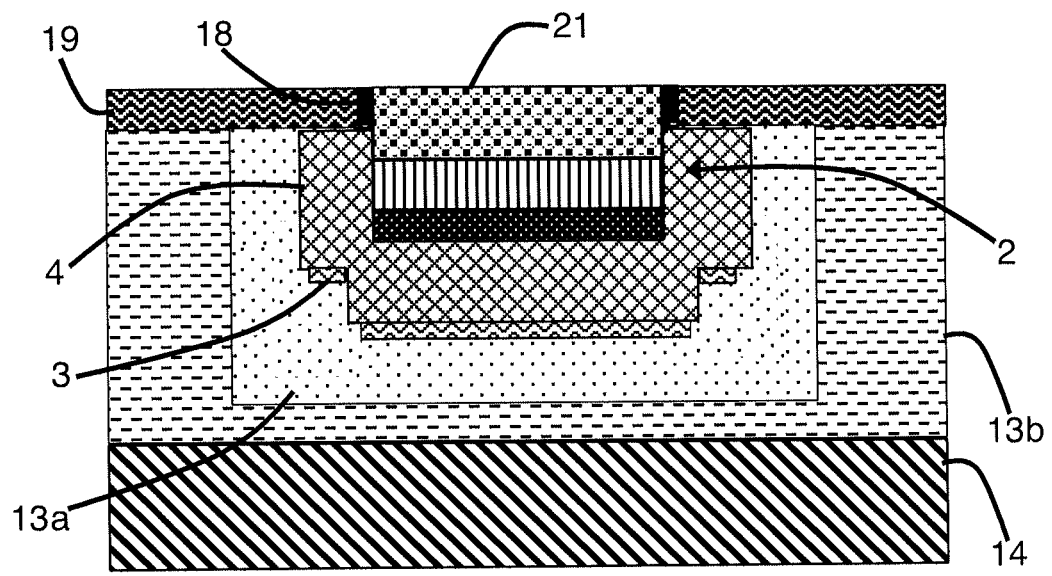
Figure 11B:
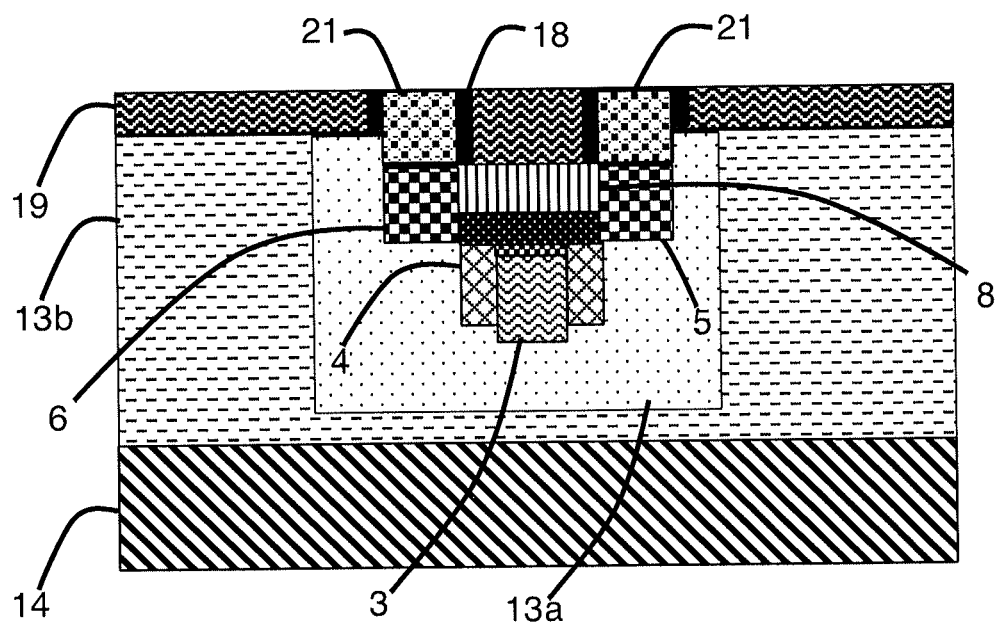

As illustrated in FIGS. 11A and 11B, an electrically conducting material 21 is deposited so as to at least partially fill the cavities 20 formed in the second cap layer 19 above the source region 5 and drain region 6. The conducting material 21 is advantageously a metal.

Figure 12A:
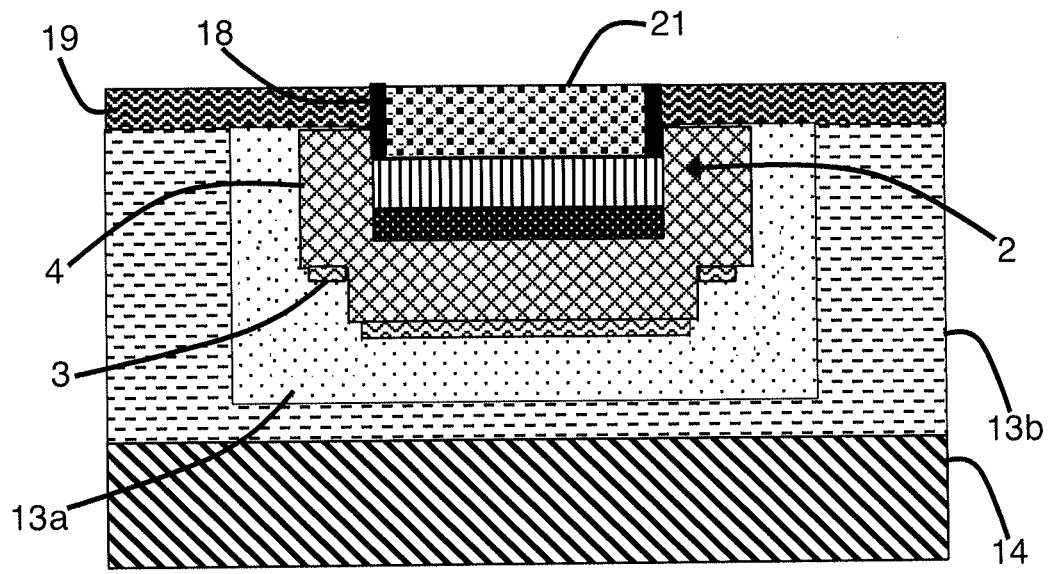
FIG. 12B represents an alternative embodiment of the field effect transistor illustrated in FIG. 11A and FIG. 11B, in schematic manner, in cross-sectional view, FIG. 13A
Figure 12B:
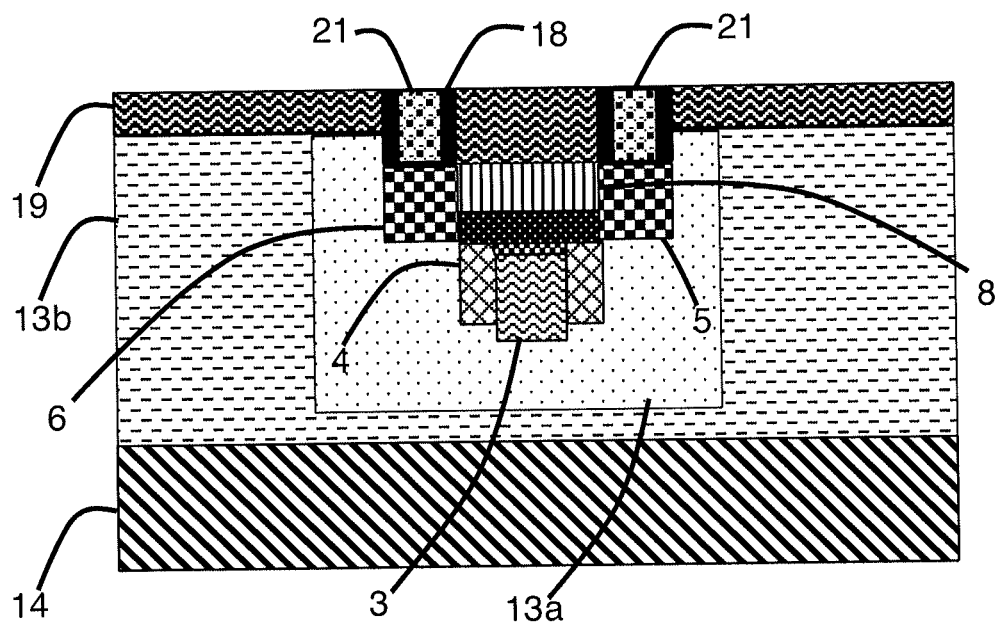

In the alternative embodiment illustrated in FIGS. 12A and 12B, the lateral spacer 18 was not formed on the walls of the patterns 17 before the layer 19 was deposited. The lateral spacer was formed on the walls of the layer 19 after elimination of the pattern 17. It is observed that the dimensions of the contacts are slightly different.

In these embodiments, it is advantageous to perform deposition of a metal followed by an anneal configured to make the metal react with the material forming the source region 5 and drain region 6 and to form an alloy 22 for example of silicide and/or germanide type.

In advantageous manner, deposition of the metal is followed by deposition of a barrier material (not shown) which is configured to block diffusion of certain elements and in particular oxygen. The barrier material is electrically conducting.

In preferential manner, deposition of the electrically conducting material 22 is followed by deposition of the barrier material, preferably a metal. Deposition of the barrier material can also be followed by deposition of another electrically conducting material, for example tungsten, in order to reduce the contact resistances.

To localise the electrically conducting material 21 and/or the metal above the source region 5 and drain region 6, it is advantageous to perform a chemical mechanical polishing step which preferentially stops at the surface of the layer 19. In preferential manner, the electrically conducting material 21 and/or the barrier material and/or the other electrically conducting material are deposited by means of a directional deposition technique, for example by spraying.

The electrically conducting material 21 and the other electrically conducting material are thus easily localised in the bottom of the cavities 20 formed by removal of the patterns 17.

For the sake of clarity, only the electrically conducting material 21 is represented in FIGS. 11A, 11B, 12A and 12B.

Figure 13A:
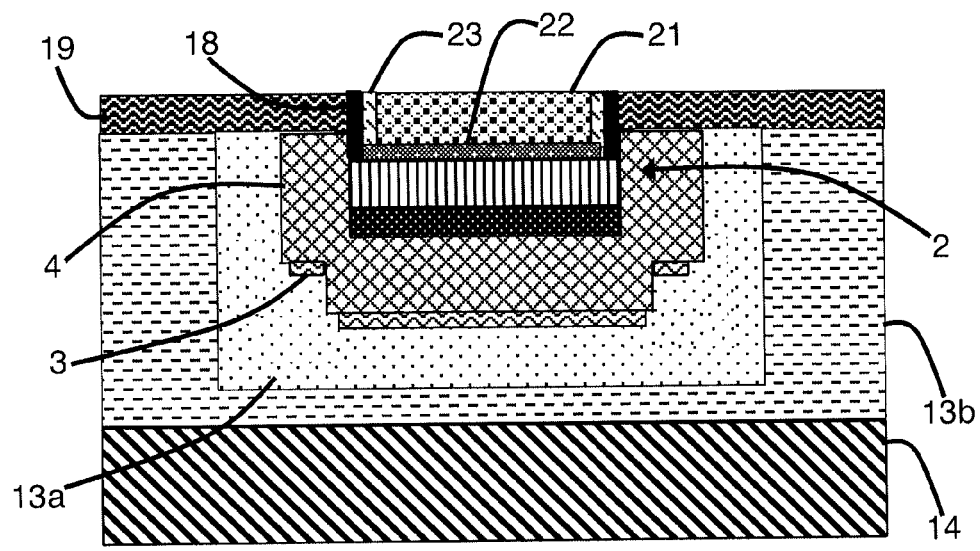
FIG. 13B represents an alternative embodiment of the field effect transistor illustrated in FIG. 11A and FIG. 11B, in schematic manner, in cross-sectional view, FIG. 14A to FIG. 18B represents successive steps of a second method for fabricating a field effect transistor, in schematic manner, in cross-sectional view, FIG. 19A to FIG. 27B represents successive steps of a third method for fabricating a field effect transistor, in schematic manner, in cross-sectional view.
Figure 13B:
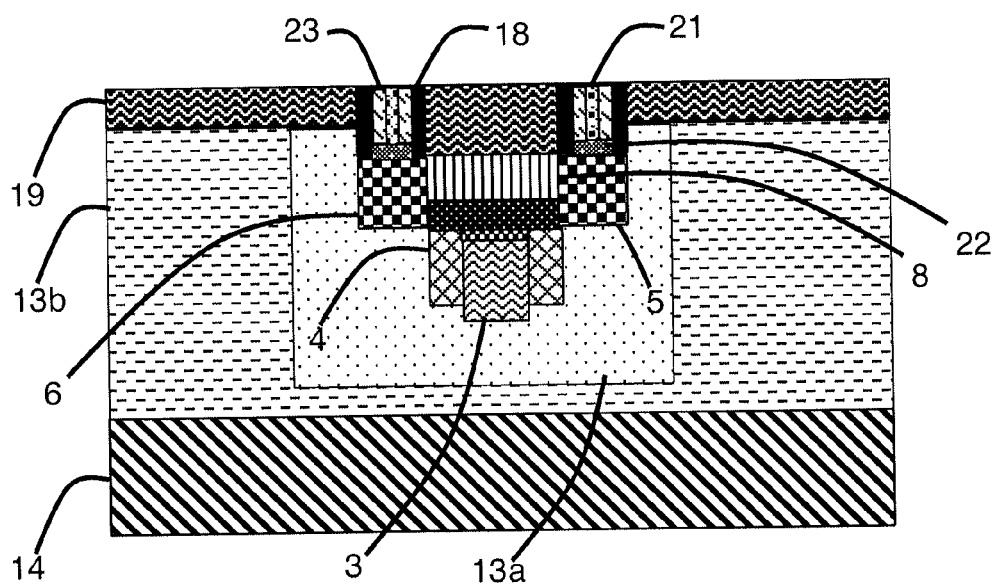

In an alternative embodiment illustrated in FIGS. 13A and 13B, an electrically insulating layer is formed after formation of the alloy 22. The electrically insulating layer is deposited in the cavities 20 formed by removal of the patterns 17 so as to cover the side walls and the bottom of the cavity 20. Preferentially, the electrically insulating layer is deposited in conformal manner, i.e. the thickness on the vertical walls is identical to the thickness on the horizontal walls.

An anisotropic etching step is performed so as to form additional lateral spacers 23 from the electrically insulating layer. These spacers 23 enable the space between the contacts be increased thereby reducing the stray capacitances between the source and drain contacts. The embodiment of FIGS. 13A and 13B with an additional spacer 23 can be achieved either in relation with the embodiment illustrated in FIGS. 11A and 11B or in relation with the embodiment of FIGS. 12A and 12B.

Subsequently, the gate electrode contact (not shown) can be fabricated by any suitable means, for example by formation of an etching mask followed by etching of the second cap layer 19 to access the gate pattern 3.

A via is formed so as to reach the gate pattern 3, the via being at least formed in the layer 19 and possibly in other layers.

An electrically conductive material, for example a metal, is then deposited so as to come into contact with the gate pattern 3.

If the gate pattern 3 is a "false gate", the latter is removed and replaced by the materials suitable for formation of a gate electrode. The pattern is removed to form a new cavity. The volume of the new cavity delineated by the semiconductor material pattern 2 and the layer 13 is then filled by a gate dielectric 3a and an electrically conducting material which will form the gate conductor.

Figure 14A:
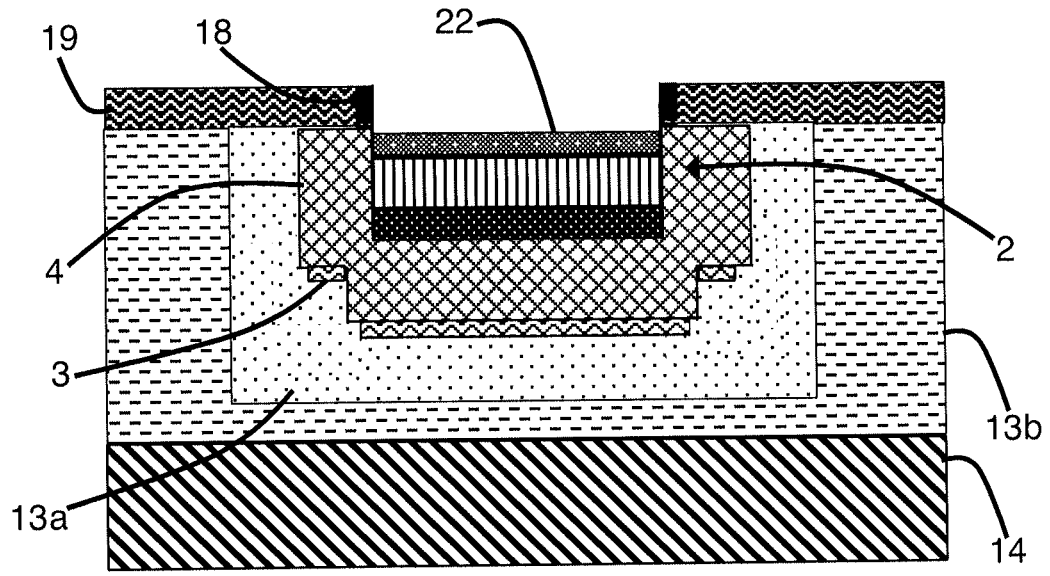
Figure 14B:
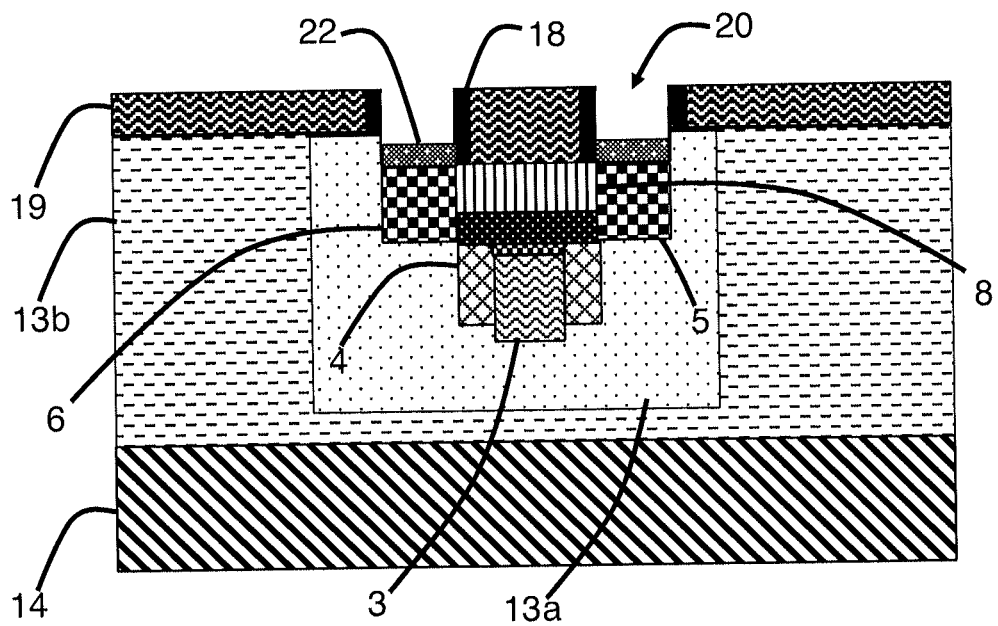

In yet another particular embodiment illustrated from FIGS. 14A and 14B, it is possible to form the contact of the gate pattern 3 and the source and drain contacts at the same time.

The beginning of the method is identical to what was described previously up to FIGS. 10A and 10B.

In this embodiment, it is particularly advantageous to deposit a metal which will be annealed to form the alloy 22 on the source and drain regions. The metal or alloy 22 can be covered by a barrier layer which is not represented.

Figure 15A:
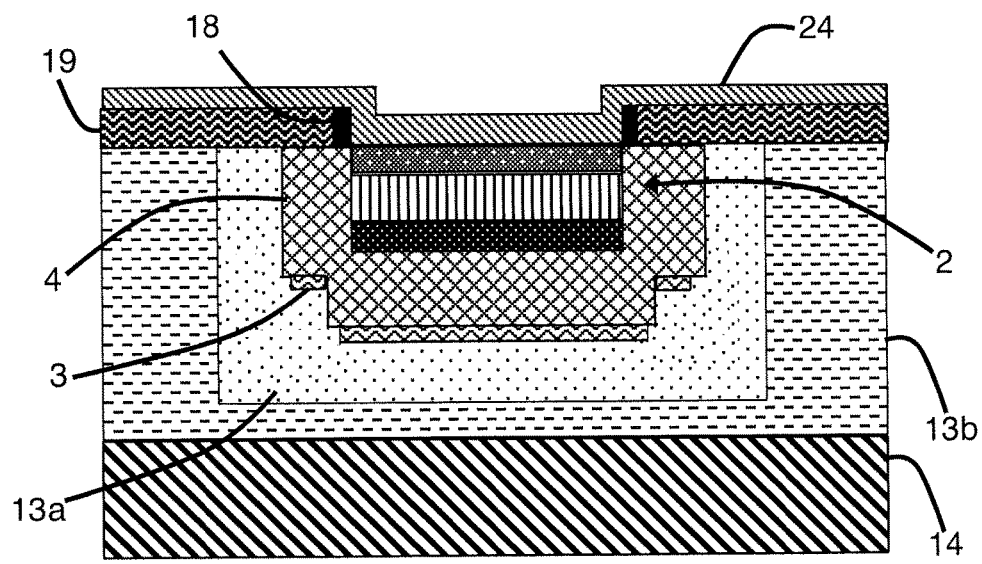
Figure 15B:
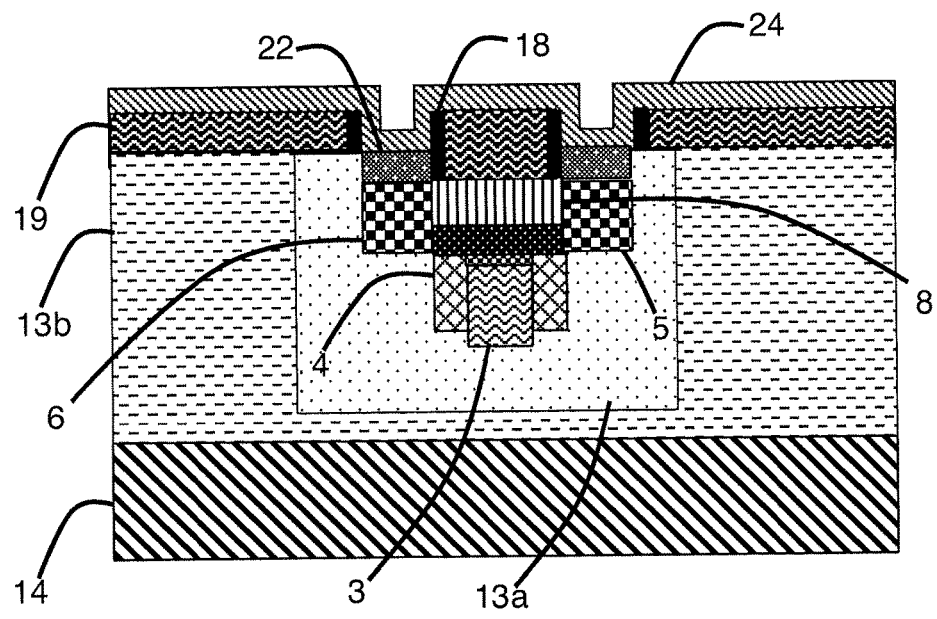

As illustrated in FIGS. 15A and 15B, an electrically insulating layer 24 is deposited in the cavities 20 to cover the side walls and the bottom of the cavity 20. In advantageous manner, the electrically insulating layer 24 is deposited in conformal manner.

Figure 16A:
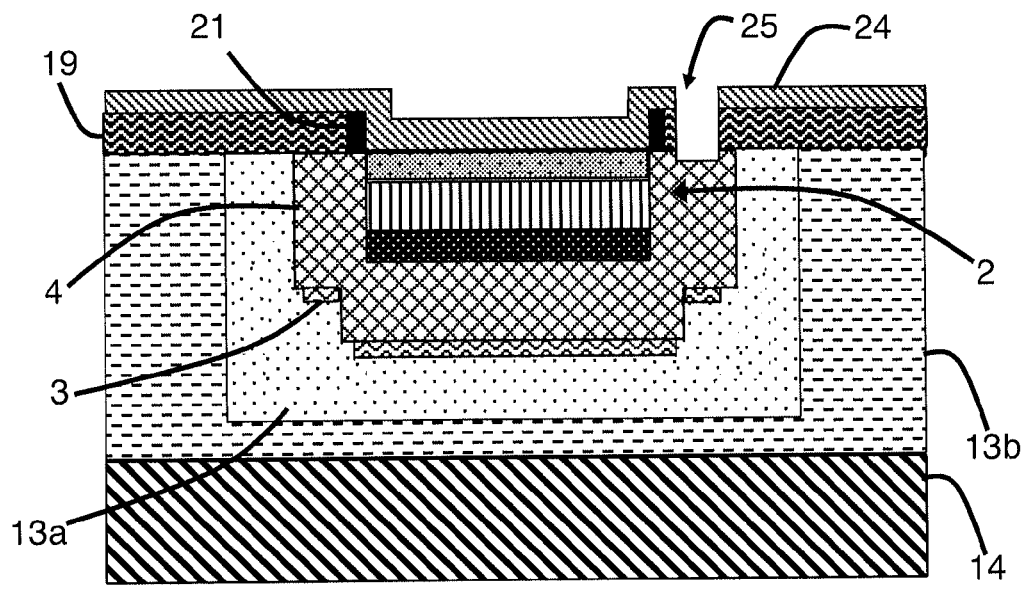
Figure 16B:
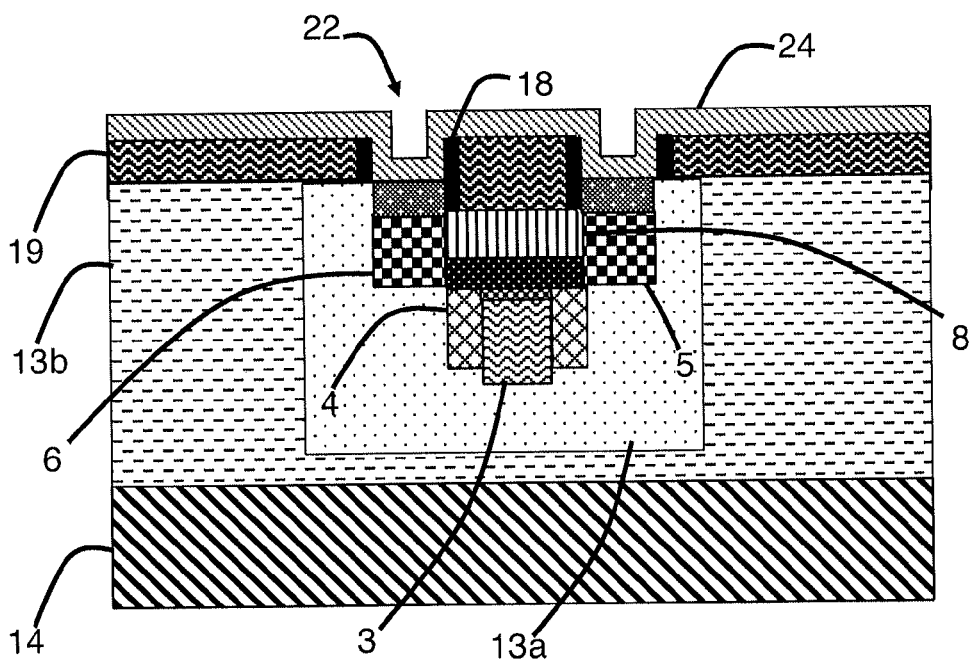

As illustrated in FIGS. 16A and 16B, a via 25 is formed in the electrically insulating layer 24 and in the layer 19 to access the gate pattern 3.

Figure 17A:
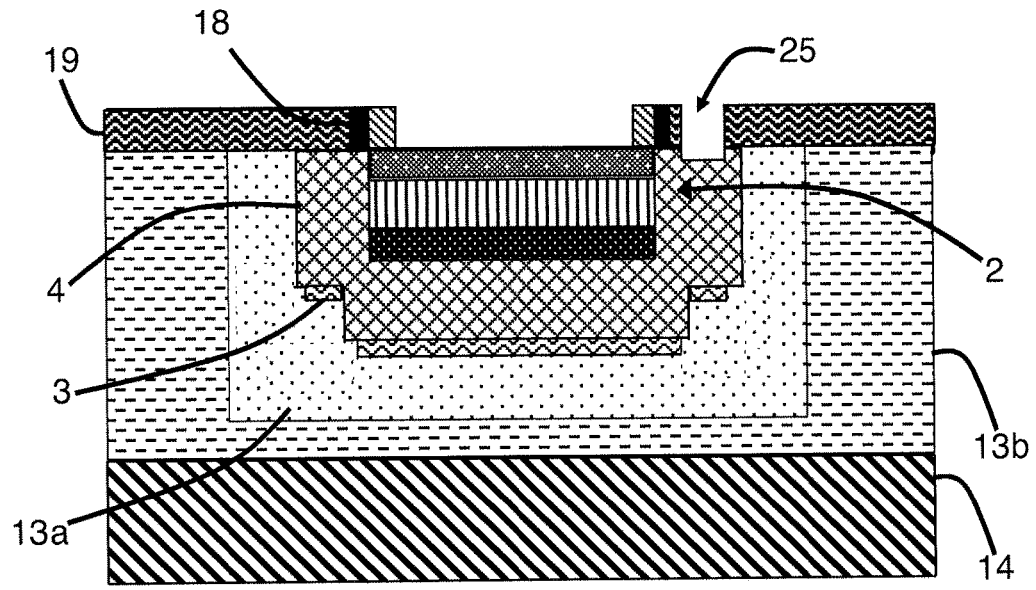
Figure 17B:
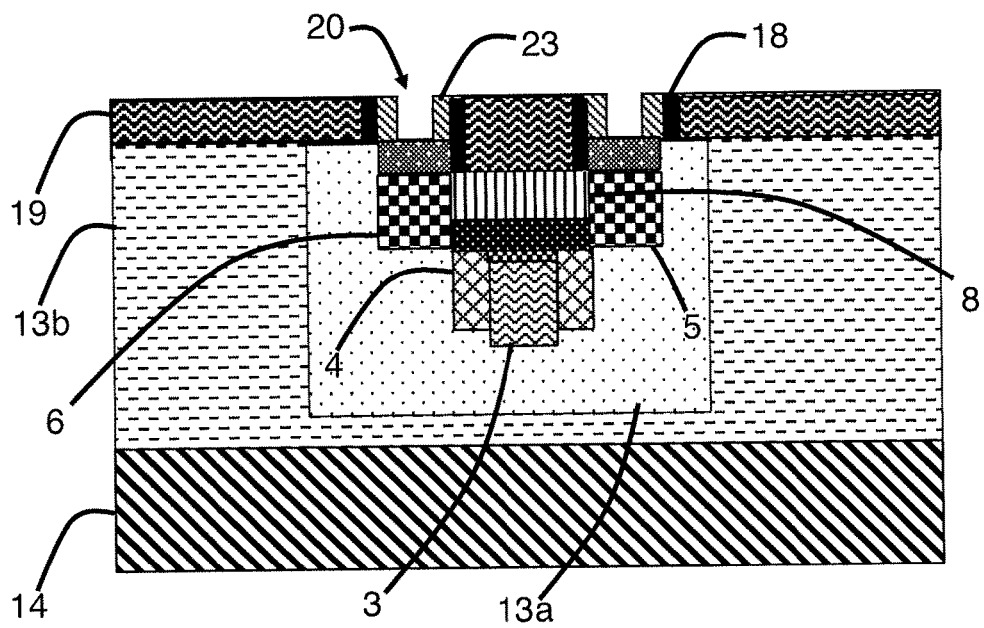

As illustrated in FIGS. 17A and 17B, anisotropic etching is then performed to form additional lateral spacers 23 from the electrically insulating layer 24. This embodiment is very close to the one illustrated in FIG. 13.

As a variant, it is possible to perform formation of the lateral spacers 23 from the layer 24 before forming the contact via 25.

It is also possible to perform formation of the contact via 25 before depositing the electrically insulating layer 24. However, this involves forming a contact via 25 having a large dimensions so as to prevent it from being refilled when deposition of the electrically insulating layer 24 is performed. Such a contact via 25 is not always able to be accomplished in a compact structure.

Figure 18A:
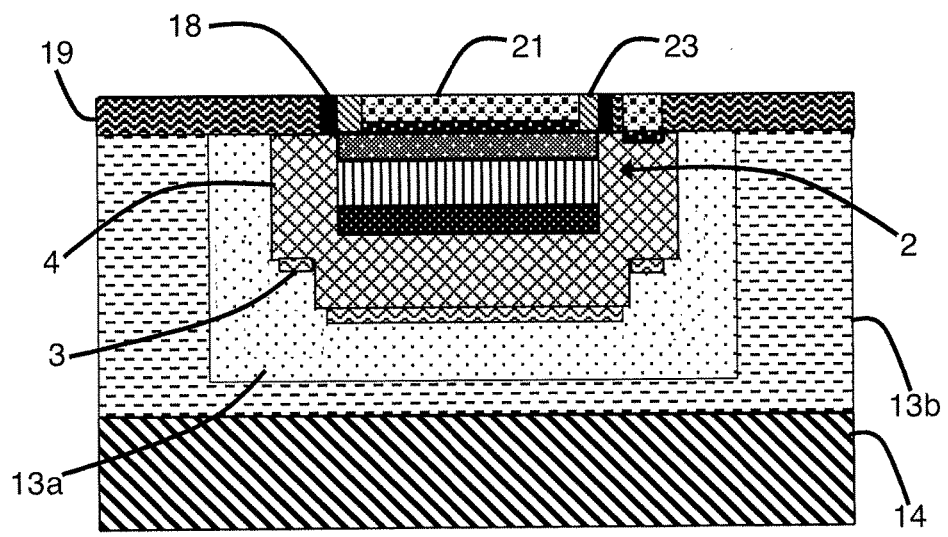
Figure 18B:
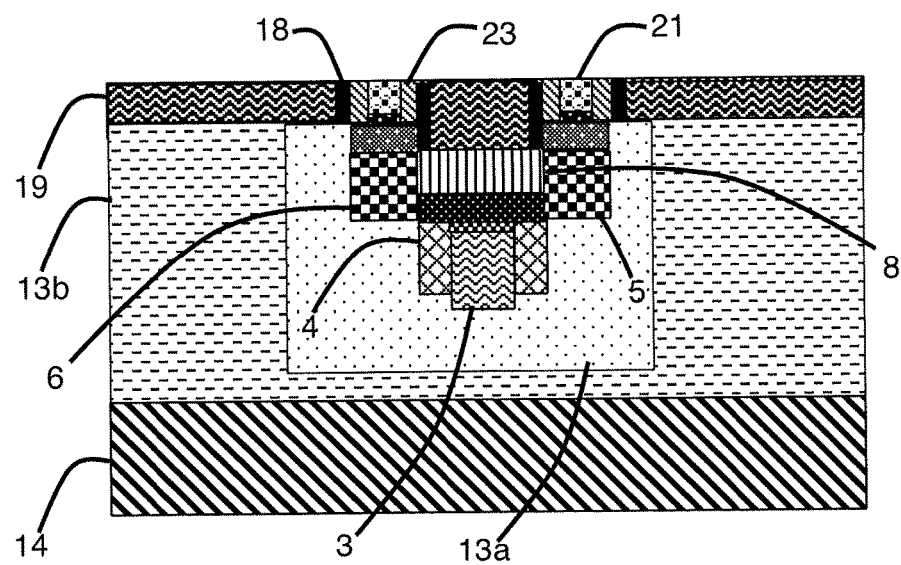

As illustrated in FIGS. 18A and 18B, one or more electrically conducting materials are then deposited so as to fill the contact via 25 and the cavities 20. It is for example possible to deposit the electrically conducting material 21.

The source and drain contacts and gate electrode contact are formed at the same time. There again, it is advantageous to perform localisation of the second electrically conducting material 21 by a chemical mechanical polishing step.

Figure 19A:
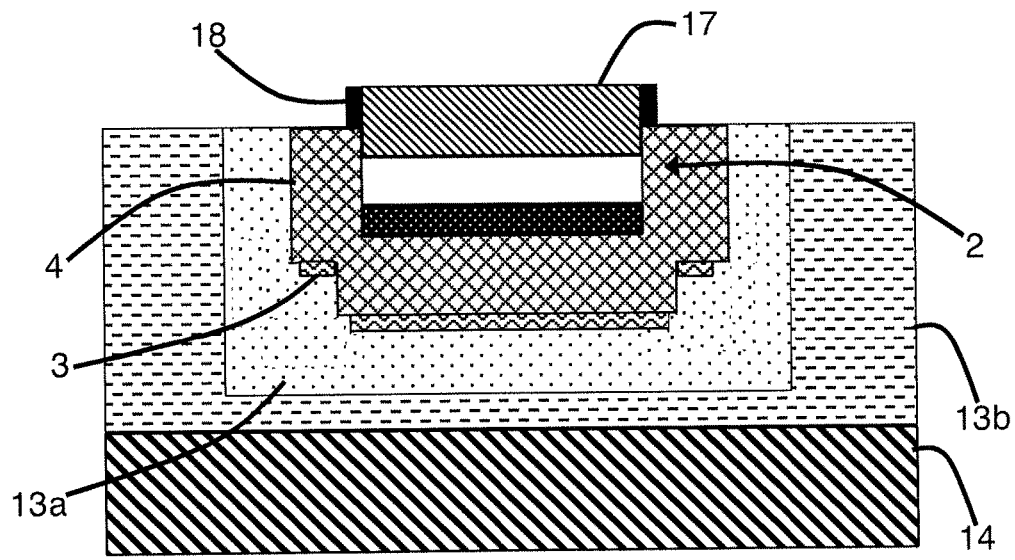
Figure 19B:
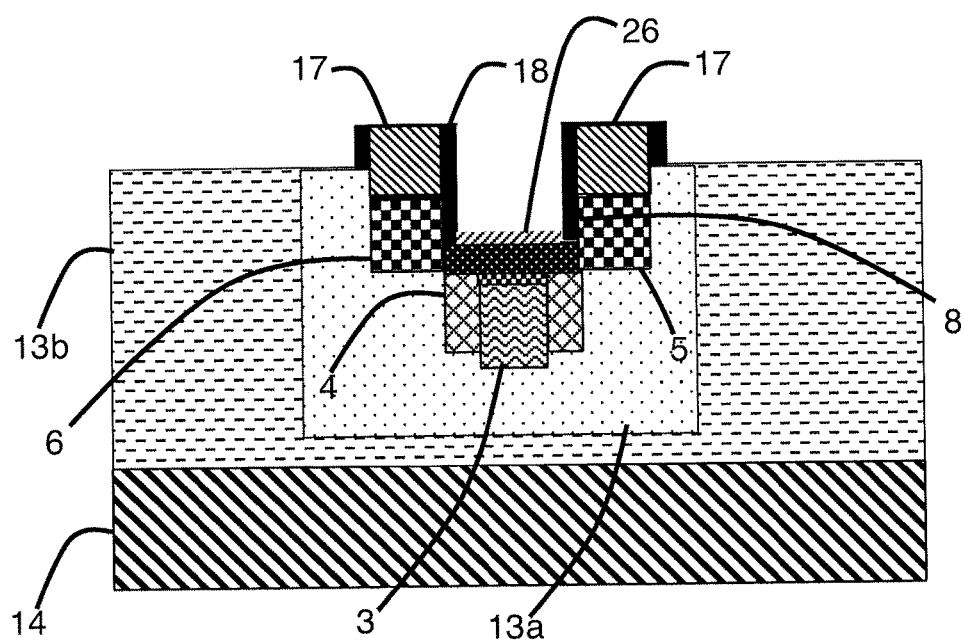

In another embodiment illustrated from FIGS. 19A and 19B, it is also possible to integrate a second gate electrode which will at least partially control the conduction channel.

The fabrication method performs the same steps as explained in the foregoing and illustrated up to FIGS. 8A and 8B.

Delineation patterns 17 are formed as before. These delineation patterns 17 are advantageously covered by the lateral spacers 18. This step is very close to what is illustrated in FIGS. 10A and 10B with the exception of the layer 19 which is not deposited.

If the dividing pattern 8 is not made from an electrically insulating material or if the electric characteristics of the dividing pattern 8 are not suitable, the dividing pattern 8 is eliminated.

If the dividing pattern 8 is too thick, it is possible to etch it partially so as to thin it.

In the illustrated embodiment, the dividing pattern 8 is eliminated and an electrically insulating material 26 is deposited to form a gate dielectric. As a variant, the lateral spacer 18 can be formed after deposition of the gate dielectric 26.

In advantageous manner, a lateral spacer 18 is formed on the side walls of the delineation patterns 17. It is particularly advantageous to make the lateral spacer 18 from an electrically insulating material and preferably from a material having a lower dielectric constant than that of silicon oxide. For example purposes, the lateral spacer 18 is made from boron nitride.

According to the embodiments, the lateral spacer 18 presses on the electrically insulating dividing pattern 8 or on the conduction channel or on a new gate dielectric 26. Advantageously, the lateral spacer 18 is formed after thinning or removal of the dividing pattern 8.

Figure 20A:
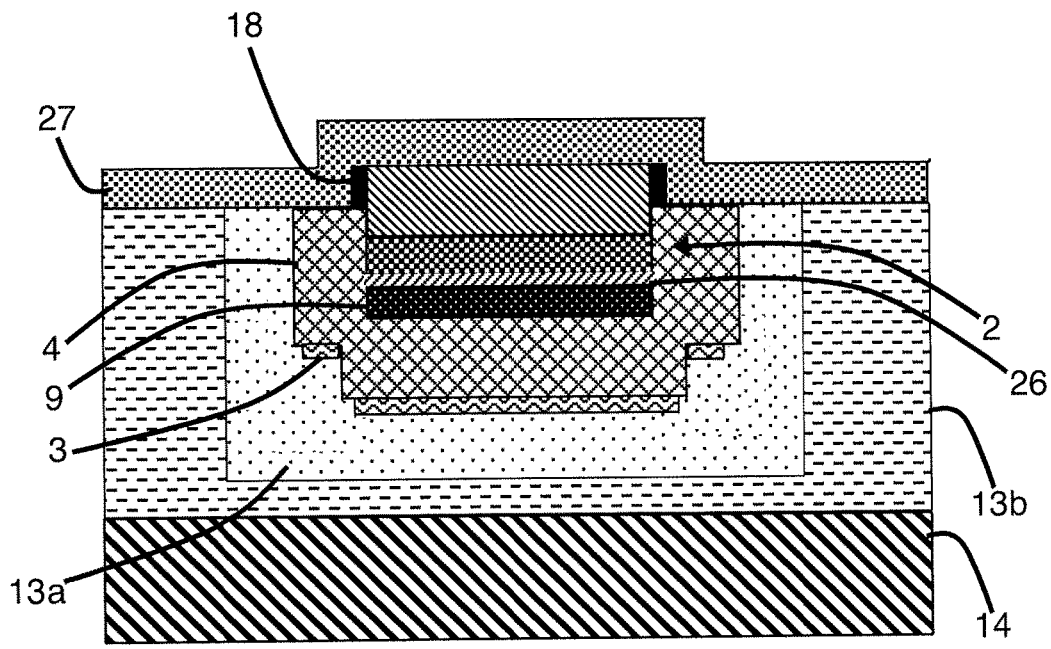
Figure 20B:
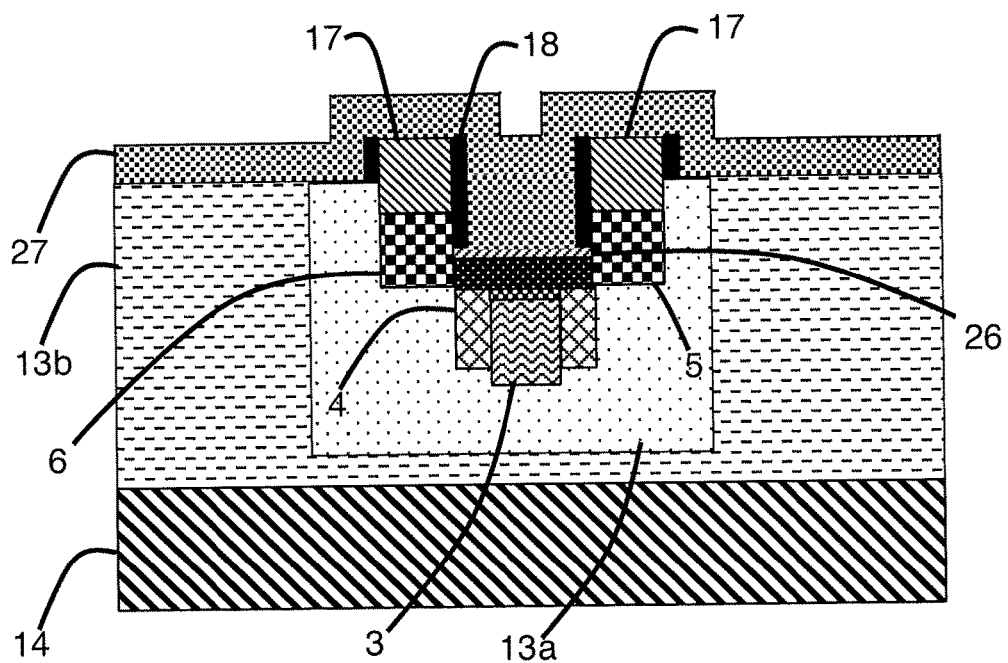

As illustrated in FIGS. 20A and 20B, a second electrically conducting material 27, advantageously a metal, is then deposited so as to cover the via arranged between the patterns 17 overlying the source and drain regions and above the conduction channel and in particular the via formed by the dividing pattern 8 if the latter is eliminated.

If the second electrically conducting material 27 also deposits on the delineation patterns 17, the latter can be removed just afterwards. In advantageous manner, if a new gate dielectric 26 is formed after elimination of the dividing pattern 8, it is advantageous to deposit the gate dielectric 26 on the patterns 17 so as to cover them and to reduce the risks of contamination or of reaction between the material 27 and the material forming the patterns 17.

If the patterns 17 are made from silicon or from silicon-germanium and the material 27 is made from metal, it is advantageous to keep the gate dielectric 26 to prevent formation of a silicide which becomes difficult to eliminate compared with the other materials present.

Figure 21A:
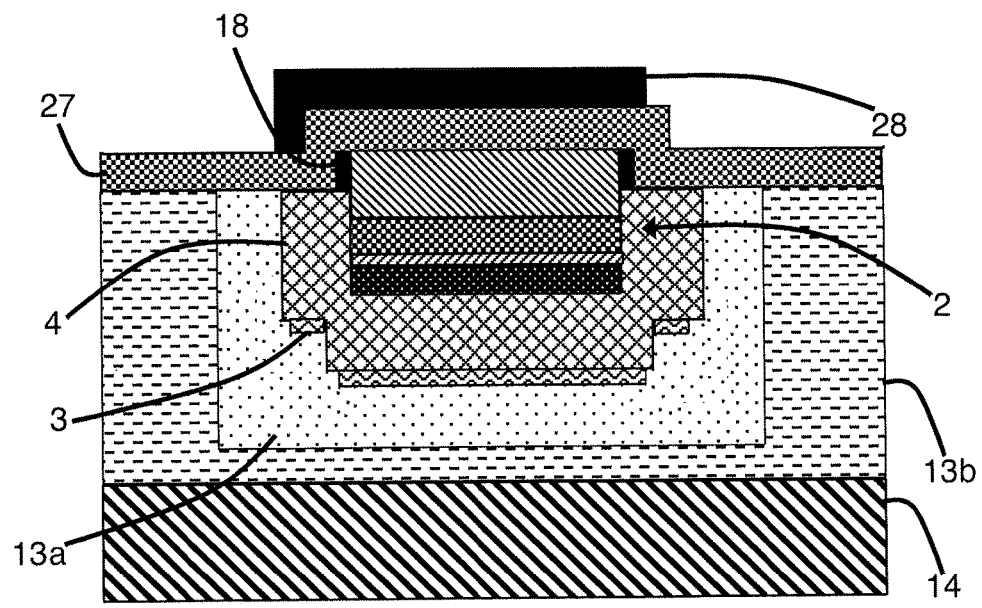
Figure 21B:
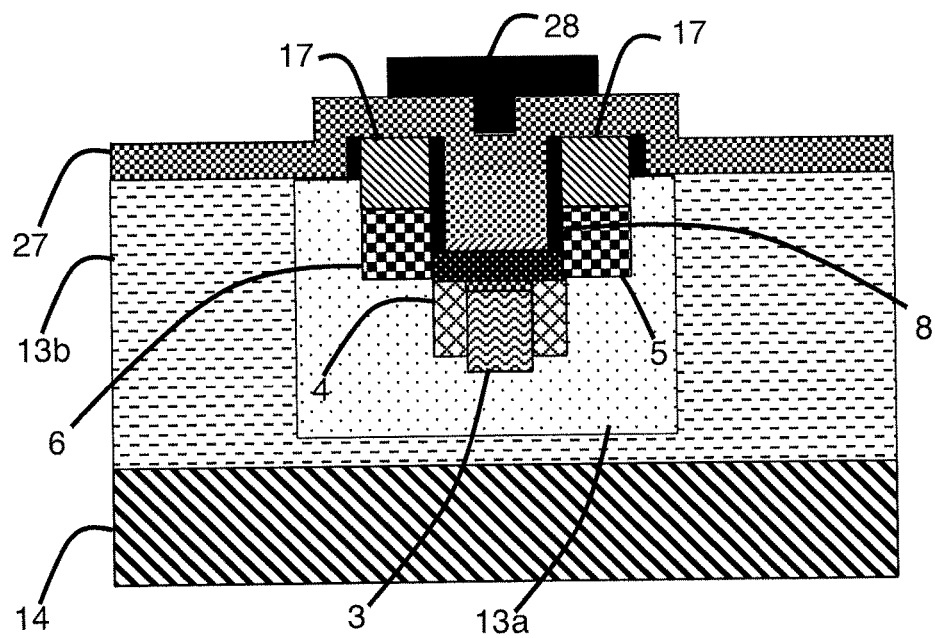

As illustrated in FIGS. 21A and 21B, an etch mask 28 is formed so as to localise the second electrically conducting material 27 at least on a part of the patterns 17 and between the two patterns 17 above the conduction channel. However, as a variant, the mask 28 can also be configured to localise the material 27 only in the cavity defined by the two patterns 17, but this involves additional alignment constraints.

Figure 22A:
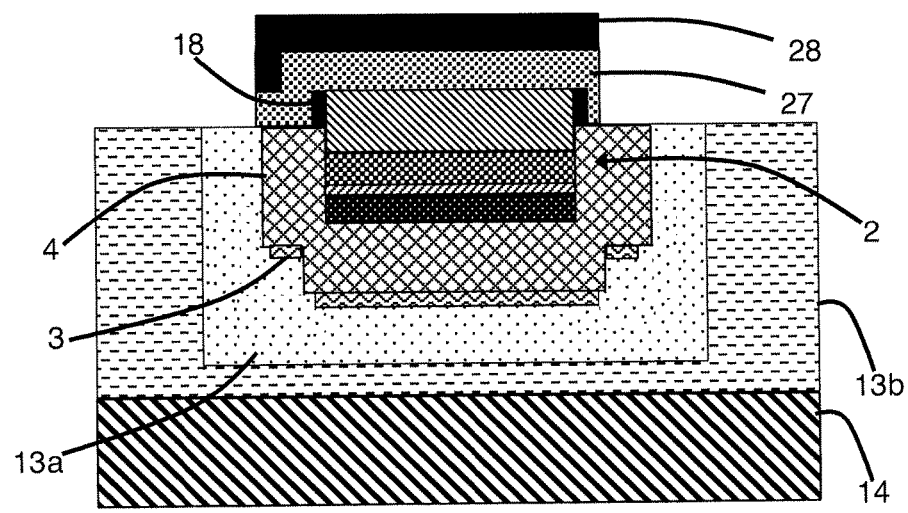
Figure 22B:
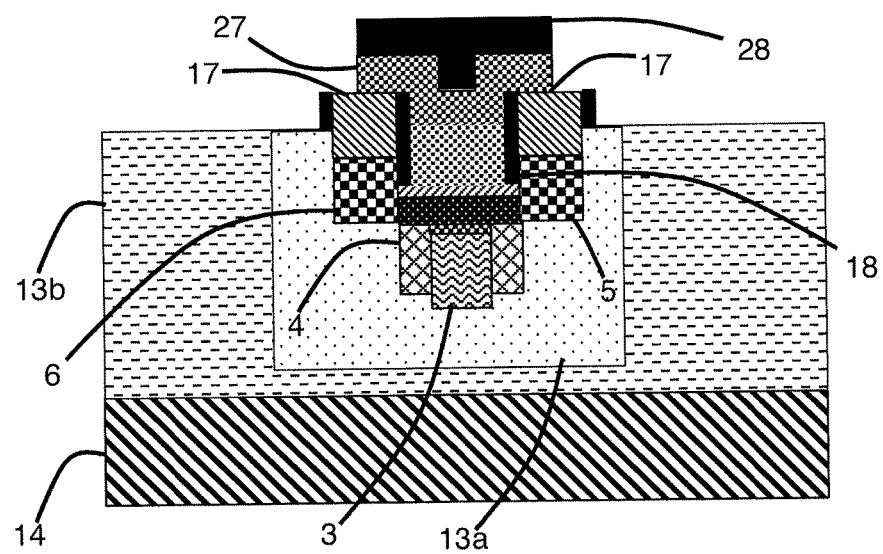

The etch mask 28 defines the length of the second gate electrode. The etch mask 28 can also be configured so that the second electrically conducting material 27 extends beyond the patterns 17 in the longitudinal direction of the patterns 17. As illustrated in FIGS. 22A and 22B, the second electrically conducting material 27 is etched in the regions not protected by the etch mask 28. In this way, the second electrically conducting material 27 will form the second gate electrode and is electrically dissociated from the other devices present on the surface of the substrate.

For example purposes, the deposition step of the second electrically conducting material 27 is followed by a chemical mechanical polishing step and possibly by reactive ion etching to lower the top level of the second electrically conducting material 27 with respect to the top level of the delineation patterns 17. The second electrically conducting material 27 forms the gate conductor for the second gate electrode.

Figure 23A:
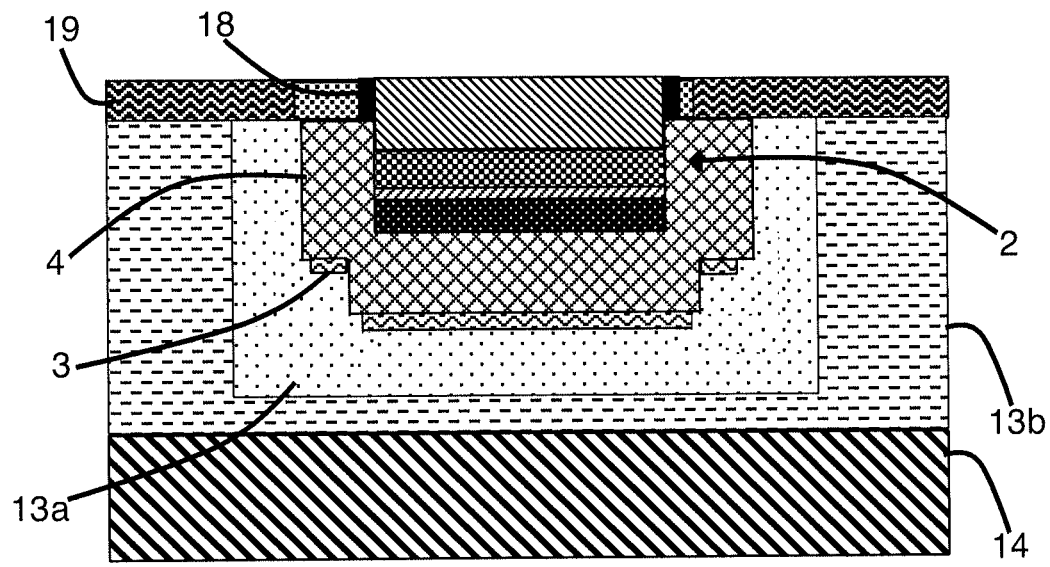
Figure 23B:
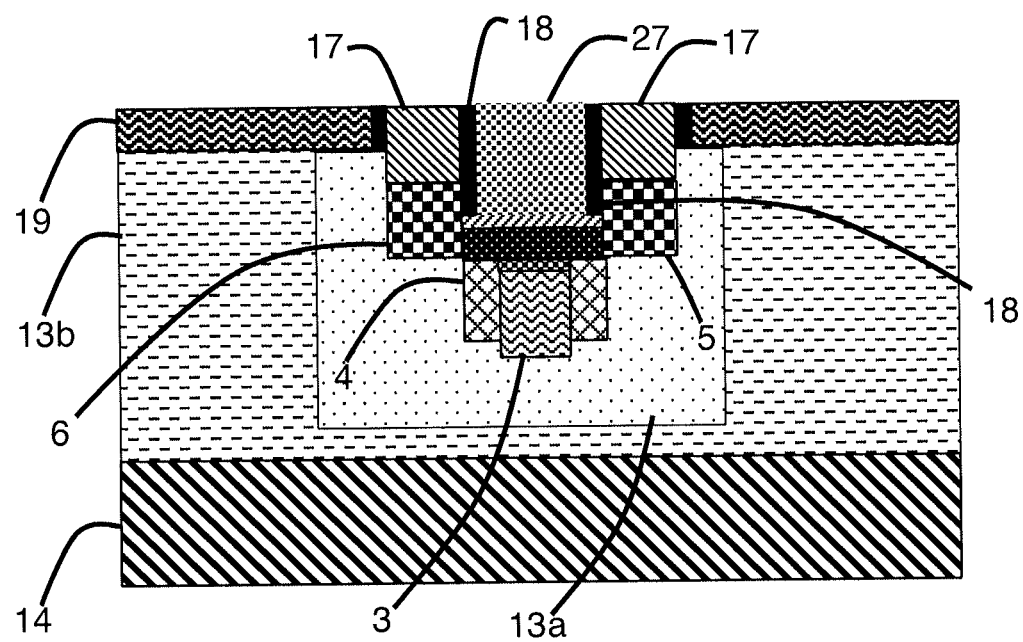

As illustrated in FIGS. 23A and 23B, the second cap layer 19 or a part of the second cap layer 19 is deposited so as to cover the substrate and to fill the vias around the delineation patterns 17. Deposition of the second layer 19 is for example a deposition on the whole surface of the substrate.

In advantageous manner illustrated in FIGS. 23A and 23B, deposition of the second cap layer 19 is followed by a chemical mechanical polishing step to form a flat surface defined by the delineation patterns 17, the material 27 between the delineation patterns 17 and the second cap layer 19.

In advantageous embodiment, the same chemical mechanical polishing step is used to localise the material 27 and the second cap layer 19.

Figure 24A:
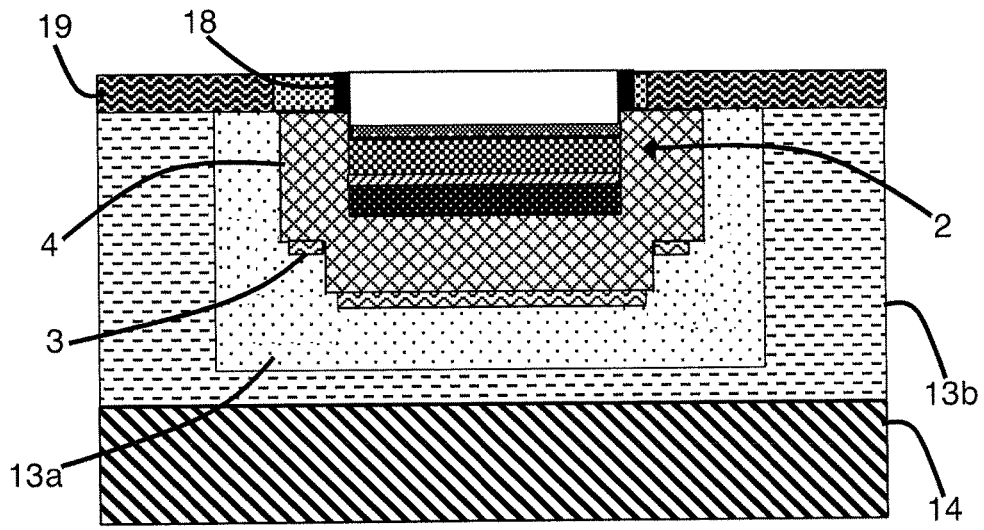
Figure 24B:
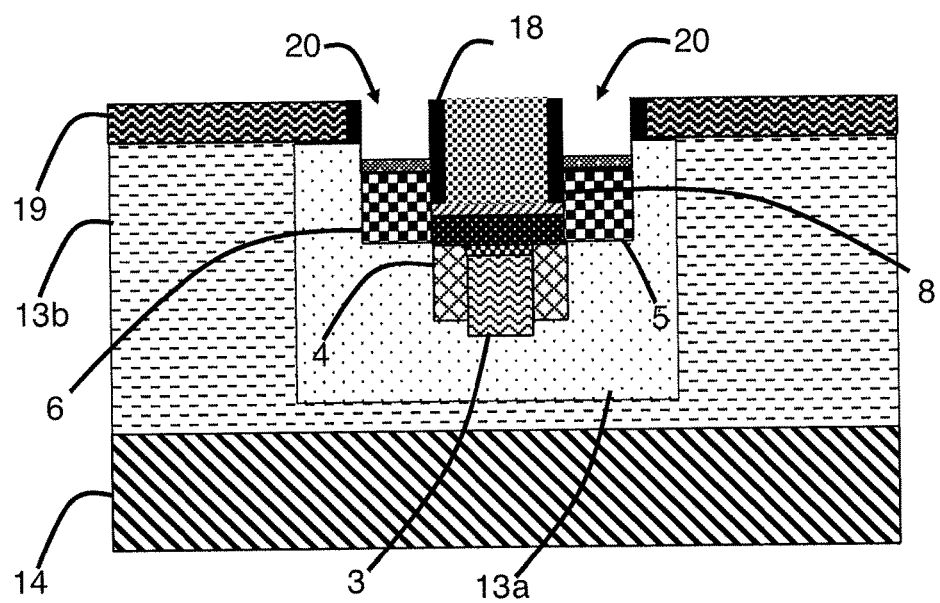

As illustrated in FIGS. 24A and 24B, the delineation patterns 17 are then eliminated to access the source region 5 and drain region 6. Elimination of the delineation patterns 17 forms the cavities 20.

Figure 25A:
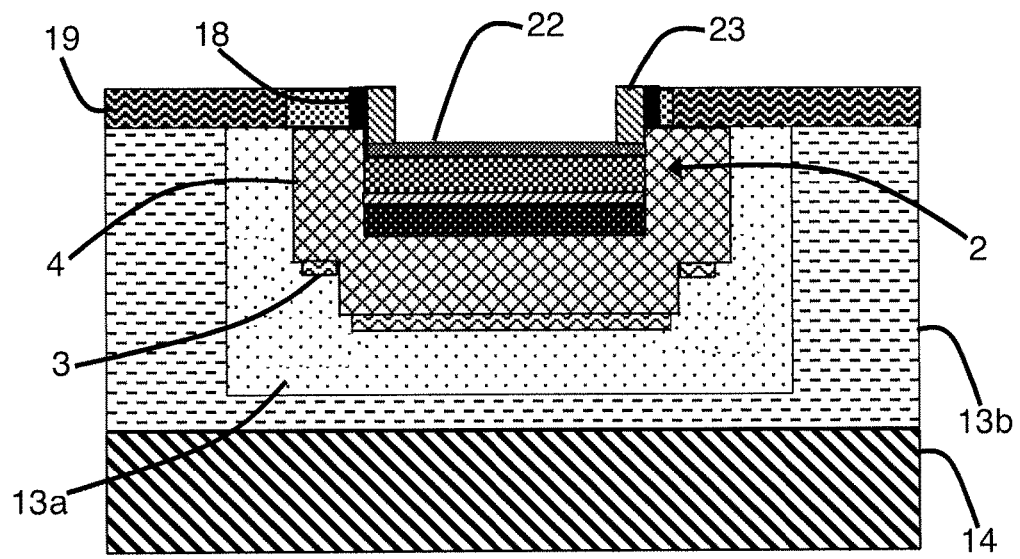
Figure 25B:
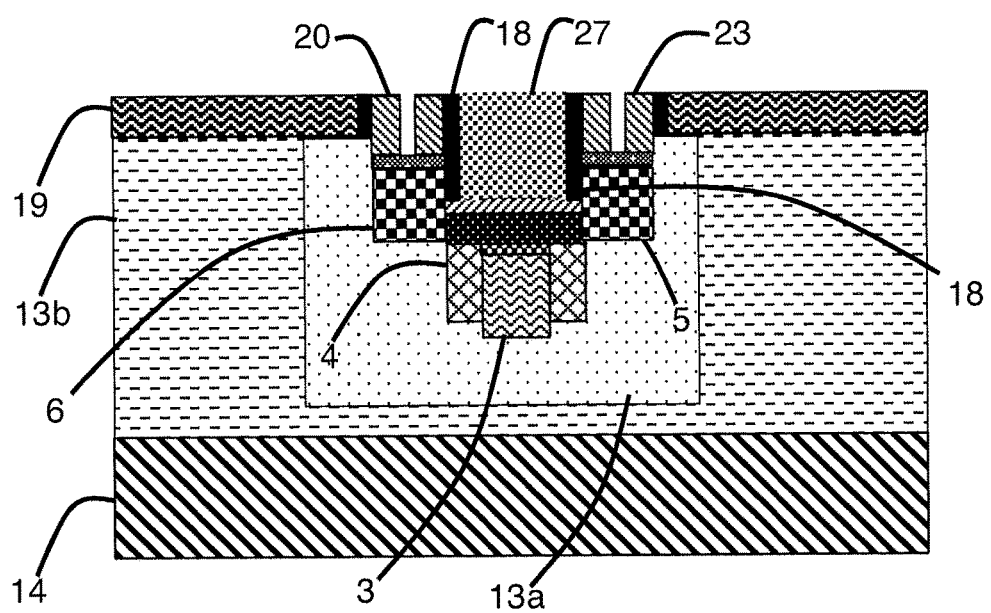

In optional manner illustrated in FIGS. 25A and 25B, an additional lateral spacer 23 can be formed on the side walls of the cavities 20. As an alternative, it is possible not to form the lateral spacer 18 on the edges of the patterns 17 before deposition of the layer 19 but to form it on the edge of the layer 19 and of the material 27 after the patterns 17 have been eliminated.

The spacer 23 can be formed by means of a deposition step followed by an anisotropic etching step.

In the illustrated embodiment, the additional lateral spacer 23 is formed after formation of the alloy 22. However, it is also possible to provide for formation of the additional lateral spacer 23 before formation of the alloy 22. The alloy 22 is an optional layer 22 but is advantageous for reducing the contact resistances.

Figure 26A:
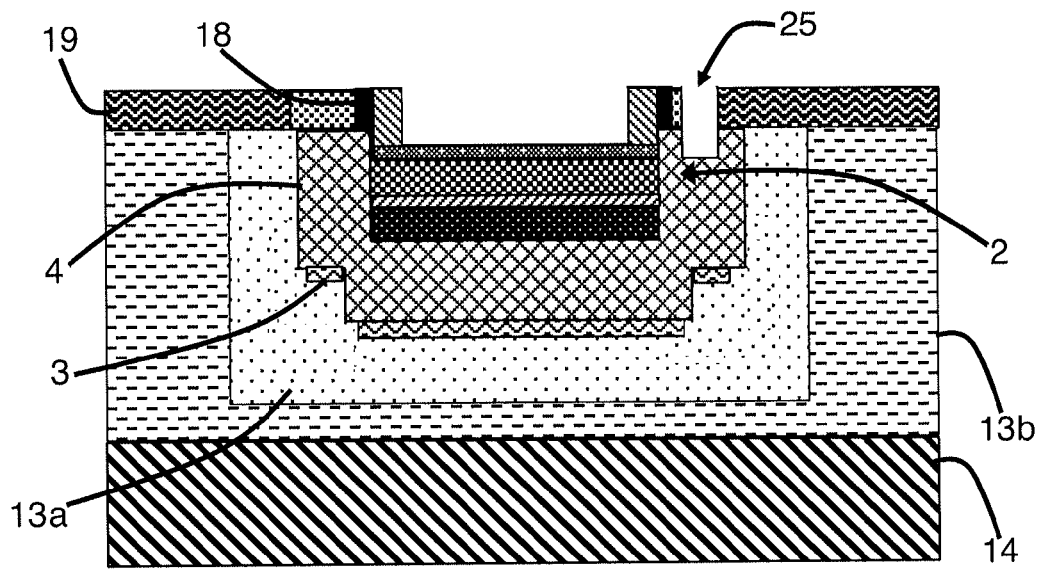
Figure 26B:
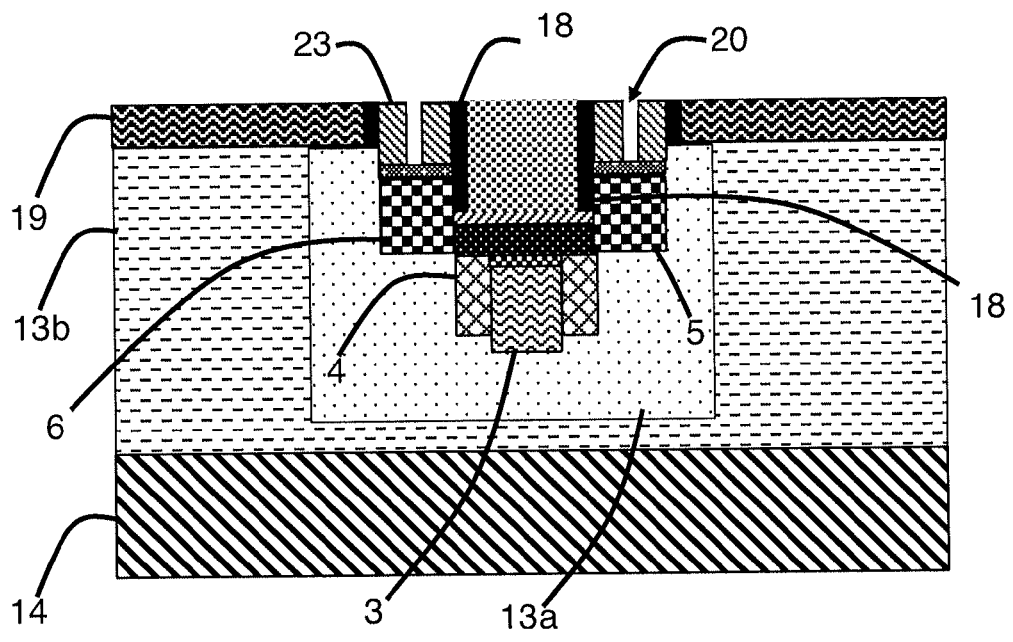

As illustrated in FIGS. 26A and 26B, a via 25 is formed so as to reach the gate pattern 3, the via 25 being at least formed in the layer 19.

Figure 27A:
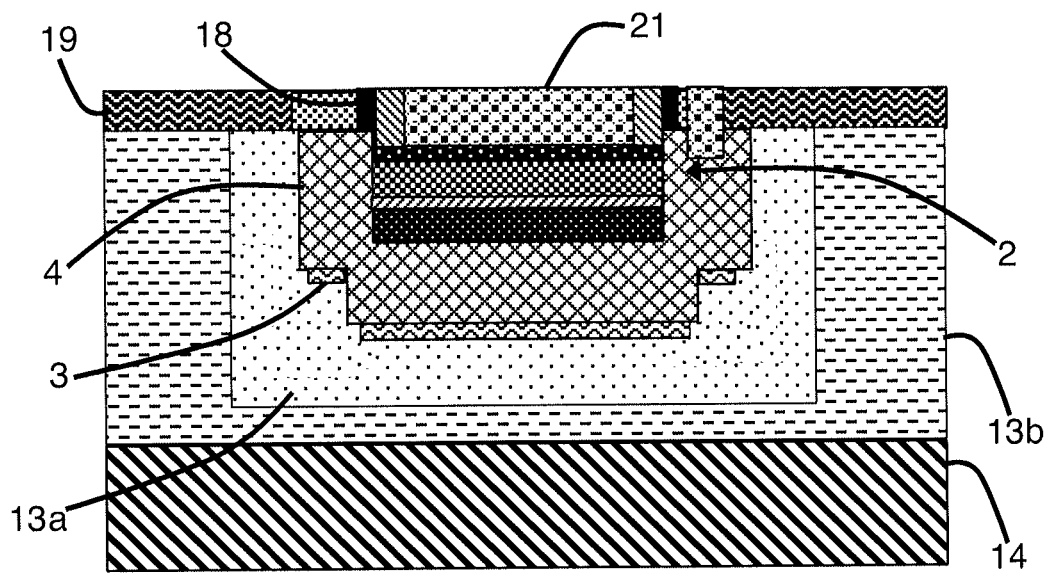
Figure 27B:
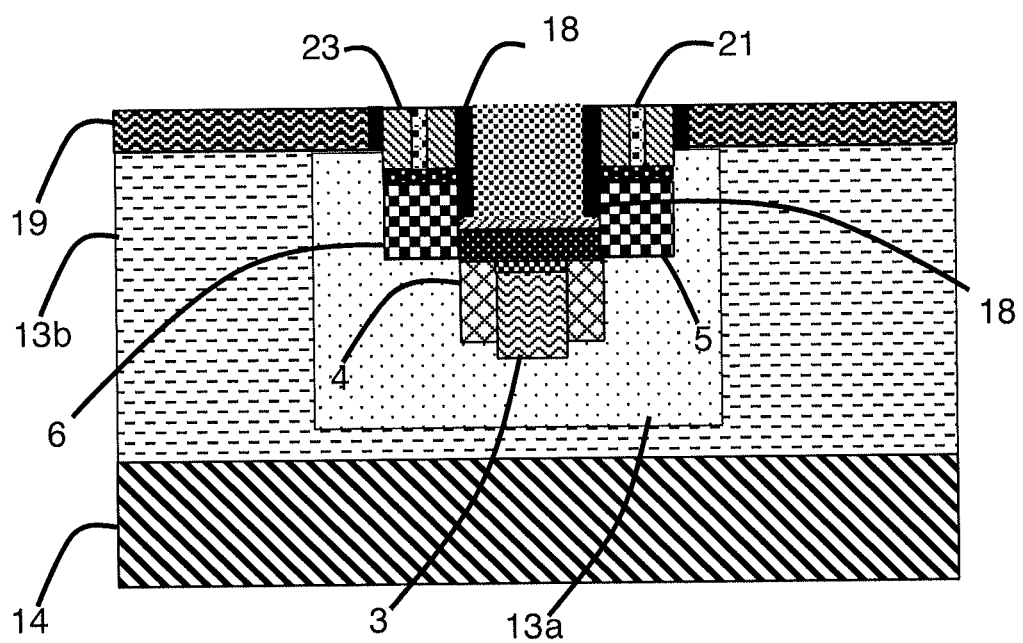

As illustrated in FIGS. 27A and 27B, an electrically conducting material 21 is deposited so as to at least partially fill the cavities formed in the second cap layer 19 above the source region 5 and drain region 6 in the cavities 20. The conducting material 21 is advantageously a metal.

To localise the electrically conducting material 21 above the source region 5 and drain region 6, it is advantageous to perform a chemical mechanical polishing step which preferentially stops at the surface of the layer 19.

In advantageous manner, deposition of the electrically conducting material 21 is preceded by deposition of a barrier material (not shown) which is configured to block diffusion of certain elements and in particular oxygen. The barrier material is electrically conducting. In preferential manner, the electrically conducting material 21 is a metallic material, for example tungsten, in order to reduce the contact resistances.

These different depositions can be followed by a localisation step for example by chemical mechanical polishing.

As a variant, the electrically conducting material 21 is deposited in directional manner, for example by spraying, and is located in the bottom of the cavities formed by removal of the patterns 17. Localisation can be obtained simply by means of a chemical mechanical polishing step.

Preferentially, the barrier layer is deposited in conformal manner, i.e. the thickness on the vertical walls is identical to the thickness on the horizontal walls.

If, when formation of the via 25 is performed, one of the side walls is at least partially formed by the material 27 located above the conduction channel, the future contact will be a contact common to the two gate electrodes.

To have two electrically dissociated gate electrodes, it is possible to form the via 25 arranged in such a way as not to come into contact with the gate electrode formed by the conducting material 21 within the layer 19.

As a variant, the via 25 formed to reach the gate pattern 3 is made after anisotropic etching of the barrier layer.

As in the previous embodiment, if the gate pattern is a "false gate", the latter is removed and replaced by the materials suitable for formation of a gate electrode.

To prevent short-circuiting between the source electrode 5 and drain electrode 6 with the second gate electrode while at the same time remaining compact, it is preferable to form an additional lateral spacer 23 between the electrodes. The additional lateral spacer 23 is made from electrically insulating material.

In the different embodiments, it can be observed that two delineation patterns 17 are formed so as to cover the source region 5 and drain region 6 and to leave the dividing pattern 8 free. The second cap layer 19 is then deposited. The first and second cap layers 13a, 13b, 19 are separated by the semiconductor material pattern 2 over at least a part thereof. The two delineation patterns 17 are eliminated to form access vias 20 to the source region 5 and to the drain region 6. In this way, the future source and drain contacts are delineated as soon as access is made to the source and drain regions to facilitate positioning of the contacts.

It is then possible to form a double-gate transistor or a FDSOI transistor with a counter-electrode.

This invention claimed is:

1. A method for fabricating a field effect device successively comprising:
   providing a substrate covered by
      dividing pattern,
      a semiconductor material pattern covering the dividing pattern, the dividing pattern comprising at least three consecutive surfaces covered by the semiconductor material pattern,
      a gate pattern covering the dividing pattern and the semiconductor material pattern so as to define a source region, a drain region and a conduction channel in the semiconductor material pattern,
   depositing a cap layer so as to cover the substrate, the semiconductor material pattern and the gate pattern,
   eliminating the substrate so as to release a part of the source region, the drain region and the gate pattern,
   forming two delineation patterns covering the source and drain regions and leaving the dividing pattern free,
   depositing a second cap layer, the first and second cap layers being separated by the semiconductor material pattern over at least a part thereof,
   eliminating the two delineation patterns to form access vias to the source region and drain region.

2. The method according to claim 1, wherein the two delineation patterns are formed by selective deposition from the source and drain regions.

3. The method according to claim 2, comprising a chemical mechanical polishing step of the second cap layer configured to release the delineation patterns.

4. The method according to claim 1, further comprising formation of lateral spacers on the edges of the two delineation patterns.

5. The method according to claim 1, further comprising formation of lateral spacers on the edges of the second cap layer after elimination of the two delineation patterns.

6. The method according to claim 4, further comprising formation of additional lateral spacers on the edges of the lateral spacers after elimination of the two delineation patterns.

7. The method according to claim 6, further comprising formation of an alloy between a metal and a semiconductor material forming the source and drain regions and wherein the additional lateral spacers are made after formation of the alloy.

8. The method according to claim 1, comprising partial etching of the dividing pattern.

9. The method according to claim 1, successively comprising:
elimination of the dividing pattern,
formation of a gate dielectric,
deposition of an electrically conducting material between the two delineation patterns to form a gate electrode.

10. The method according to claim 4, successively comprising:
elimination of the dividing pattern,
formation of a gate dielectric,
Deposition of an electrically conducting material between the two delineation patterns to form a gate electrode and
wherein the lateral spacer comprises at least one layer made from material having a lower dielectric constant than that of silicon oxide.

11. The method according to claim 9, comprising a chemical mechanical polishing step to localise the electrically conducting material between the two delineation patterns.

12. The method according to claim 9, wherein the gate dielectric is deposited on the two delineation patterns before deposition of the electrically conducting material.

13. The method according to claim 1, wherein the dividing pattern is made from an electrically insulating material and comprising, after elimination of the substrate, deposition of a metallic material and annealing of the latter to form an alloy between the metallic material and a semiconductor material forming the source and/or drain regions.

14. A method for fabricating a field effect device successively comprising:
providing a substrate covered by
a semiconductor material pattern comprising a first layer made from first semiconductor material covering a second layer made from second semiconductor material,
a gate pattern covering the semiconductor material pattern,
etching the first layer made from first semiconductor material using the gate pattern as etching mask,
etching the second layer made from second semiconductor material so as to form a cavity and to suspend the first layer made from first semiconductor material,
depositing a filling material so as to fill the cavity,
etching the filling material using the gate pattern as etching mask to form a dividing pattern,
depositing a semiconductor material so that the dividing pattern comprises at least three consecutive surfaces covered by the semiconductor material pattern, the gate pattern covering the dividing pattern and defining a source region, a drain region and a conduction channel in the semiconductor material pattern,
depositing a cap layer so as to cover the substrate, the semiconductor material pattern and the gate pattern,
eliminating the substrate so as to release a part of the source region, drain region and gate pattern,
forming two delineation patterns covering the source and drain regions and leaving the dividing pattern free,
depositing a second cap layer, the first and second cap layers being separated by the semiconductor material pattern over at least a part thereof,
eliminating the two delineation patterns to form access vias to the source region and drain region.

15. The method according to claim 14, further comprising a selective epitaxy steps so as to form the source and drain regions after formation of the dividing pattern.

16. The method according to claim 15, wherein the substrate is covered by a semiconductor material pattern successively comprising a first layer made from first semiconductor material, a second layer made from second semiconductor material and a third layer made from third semiconductor material, and wherein the etches of the second layer and of the filling material are configured to preserve at least a part of the third layer so as to enable formation of the source and drain regions from the third layer when the selective epitaxy step is performed.

17. The method according to claim 10, comprising a chemical mechanical polishing step to localise the electrically conducting material between the two delineation patterns.

* * * * *